United States Patent
Edo et al.

(10) Patent No.: US 7,872,629 B2
(45) Date of Patent: Jan. 18, 2011

(54) SHIFT REGISTER CIRCUIT AND DISPLAY APPARATUS USING THE SAME

(75) Inventors: Susumu Edo, Mobara (JP); Shinichi Komura, Mobara (JP); Masatoshi Wakagi, Hitachinaka (JP)

(73) Assignee: Hitachi Displays, Ltd., Chiba (JP)

( * ) Notice: Subject to any disclaimer, the term of this patent is extended or adjusted under 35 U.S.C. 154(b) by 1115 days.

(21) Appl. No.: 11/526,648

(22) Filed: Sep. 26, 2006

(65) Prior Publication Data

US 2007/0070020 A1    Mar. 29, 2007

(30) Foreign Application Priority Data

Sep. 29, 2005  (JP)  ............... 2005-284392

(51) Int. Cl.
    *G09G 3/36*  (2006.01)
(52) U.S. Cl. ........................................ 345/100; 377/64
(58) Field of Classification Search .................. 345/100; 377/64–81
    See application file for complete search history.

(56) References Cited

U.S. PATENT DOCUMENTS

| | | | | |
|---|---|---|---|---|
| 5,812,284 A * | 9/1998 | Mizutani et al. | ............ | 358/482 |
| 7,203,264 B2 * | 4/2007 | Lo et al. | ............ | 377/64 |
| 7,333,586 B2 * | 2/2008 | Jang | ............ | 377/64 |
| 7,381,987 B2 * | 6/2008 | Lee et al. | ............ | 257/57 |
| 7,522,145 B2 * | 4/2009 | Lee et al. | ............ | 345/100 |
| 2003/0076346 A1 | 4/2003 | Yun | | |
| 2005/0008114 A1 | 1/2005 | Moon | | |
| 2006/0262074 A1 * | 11/2006 | Shimoda | ............ | 345/100 |
| 2006/0267912 A1 * | 11/2006 | Lee et al. | ............ | 345/100 |
| 2007/0040793 A1 * | 2/2007 | Kim et al. | ............ | 345/100 |

FOREIGN PATENT DOCUMENTS

| | | |
|---|---|---|
| JP | A-05-267636 | 10/1993 |
| JP | A-2003-0043104 A1 | 3/2003 |
| JP | 2004-348940 | 12/2004 |
| JP | A-2005-050502 | 2/2005 |

* cited by examiner

*Primary Examiner*—Amare Mengistu
*Assistant Examiner*—Dmitriy Bolotin
(74) *Attorney, Agent, or Firm*—Antonelli, Terry, Stout & Kraus, LLP.

(57) ABSTRACT

A shift register circuit which stably operates with low electric power consumption and can realize a long life. In the shift register circuit constructed by connecting a plurality of fundamental circuits in each of which fundamental clocks of three phases are inputted to input terminals and is constructed by a gate line driving circuit, a timing control circuit, and a holding device control circuit, each of the gate line driving circuit and the timing control circuit has charging devices and holding devices. A node is stabilized by the timing control circuit.

26 Claims, 10 Drawing Sheets

SHIFT REGISTER CIRCUIT AND DISPLAY APPARATUS USING THE SAME

INCORPORATION BY REFERENCE

The present application claims priority from Japanese application JP 2005-284392 filed on Sep. 29, 2005, the content of which is hereby incorporated by reference into this application.

BACKGROUND OF THE INVENTION

1. Field of the Invention

The invention relates to a shift register circuit and a display apparatus using such a circuit and, more particularly, to an LCD (Liquid Crystal Display) or a TFT (Thin Film Transistor) active matrix display.

2. Description of the Related Art

Hitherto, in an amorphous silicon (a-Si) TFT-LCD, in order to reduce fabrication costs and driving IC costs, improve the reliability, and reduce an area of a non-display portion, a shift register built-in type system in which a shift register circuit for scanning gate lines is integrated simultaneously with TFTs of a pixel portion and mounted has been proposed. As a typical example of such a system, for example, JP-A-2004-348940 can be mentioned.

The conventional shift register circuit also disclosed in JP-A-2004-348940 has the following two problems: (1) stability of a gate terminal of an output transistor for driving the gate line; and (2) a through-current.

First, the problem (1) will be explained. In the conventional a-Si TFT, there is a problem of "threshold shift" in which if a voltage which is higher (lower) than that at each of a first terminal and a second terminal is continuously applied to a gate terminal (such a state is called a "DC stress"), a threshold voltage of the TFT is shifted to a higher (lower) voltage. It has been known that a similar problem occurs not only in the a-Si TFT but also in an organic TFT or the like.

In the case of driving the output transistor by using such a TFT, if a time during which the high-level voltage is applied to the gate terminal of the TFT becomes long, the threshold shift progresses and driving ability deteriorates in accordance with the elapse of time. If the driving ability of the TFT deteriorates, upon preparation for the operation of the self stage, a capacitor connected to the gate terminal of the output transistor cannot be charged to an sufficient voltage and a defective operation is caused.

The problem (2) will now be explained. In the conventional shift register circuit, upon preparation for the operation of the self stage, the through-current flows through two transistors in the ON state. Since the through-current is so-called a wasteful current which does not directly contribute to the driving of the gate line, it is desirable that such a current does not exist.

SUMMARY OF THE INVENTION

It is, therefore, an object of the invention to solve the above problems and provide a shift register circuit having excellent stability and power saving performance and a display apparatus using such a circuit.

According to the invention, particularly, as shown in FIG. 3, a fundamental circuit 17 of a shift register circuit to drive gate lines (scanning lines) of a display apparatus is constructed by a gate line driving circuit 14, a timing control circuit 15, and a holding device control circuit 16. An input node N1 of a gate line charging device T1 in the gate line driving circuit 14 is stabilized by the timing control circuit 15. Thus, an output OUT of the gate line driving circuit 14 is also stabilized and the gate line can be stably driven.

According to the invention, particularly, as shown in FIGS. 4 and 6, the holding device control circuit 16 in the fundamental circuit 17 is constructed by a setting device T6, a resetting device T7, and a holding capacitor C2. Since a second input terminal IN2 and a third input terminal IN3 in the holding device control circuit 16 are not simultaneously set to the H level, an unnecessary current is not consumed.

According to the invention, particularly, as shown in FIG. 8, the timing control circuit 15 in the fundamental circuit 17 is constructed by a GDC (Gate line Drive Circuit) charging device T4, a GDC discharging device T5, and a GDC holding device T8, and the node N1 is stabilized. Thus, the gate line can be stably driven.

According to the invention, particularly, as shown in FIG. 9, since the fundamental circuit 17 is constructed by the gate line driving circuit 14, the timing control circuit 15, a gate line holding device control circuit (first holding device control circuit) 19, and a GDC holding device control circuit (second holding device control circuit) 18, an unnecessary current is not consumed.

According to the invention, particularly, as shown in FIG. 11, the GDC holding device control circuit 18 is constructed by a setting device T9, a resetting device T10, and a holding capacitor C3. An output from a fundamental circuit of two stages before is inputted to a gate terminal of the resetting device T10. Thus, the GDC holding device T8 can be certainly turned off before the GDC charging device T4 is turned on. The generation of the wasteful through-current can be prevented.

According to the invention, particularly, as shown in FIG. 14, the shift register circuit is arranged to both sides of the display apparatus, so that the output of the fundamental circuit of two stages before which is inputted to a fifth input terminal IN5 of each fundamental circuit can be located just over the self stage, and there is an advantage that its wiring is simplified. Further, there is an advantage that a gate wiring 5 of a display unit can be used as a wiring which is inputted to a third input terminal IN3 from an output terminal OUT of the fundamental circuit of the front stage.

As mentioned above, according to the shift register circuit and the display apparatus of the invention, the stable operation with low electric power consumption can be realized without causing the problem of the deterioration in reliability.

Other objects, features and advantages of the invention will become apparent from the following description of the embodiments of the invention taken in conjunction with the accompanying drawings.

DETAILED DESCRIPTION OF THE EMBODIMENTS

Embodiments of the invention will be described hereinbelow with reference to the drawings.

Embodiment 1

Figure 1:
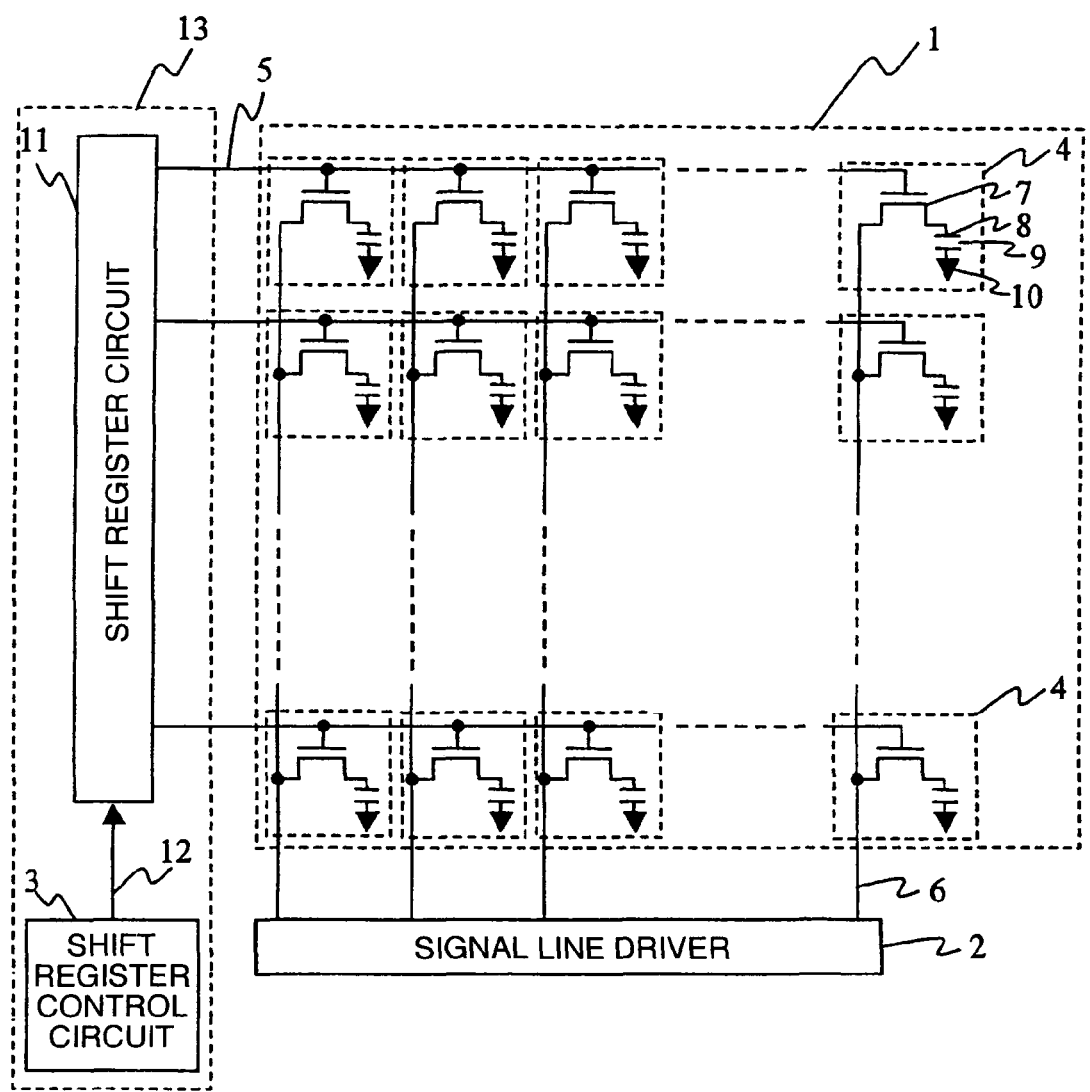
FIG. 1 is a whole schematic diagram of an embodiment of a display apparatus according to the present invention.

FIG. 1 is a schematic diagram showing a whole construction of a display apparatus according to the present invention. The display apparatus is constructed by a display unit 1, a signal line driver 2, and a gate line driver 13. Pixel portions 4 are arranged in a matrix form in the display unit 1 formed on a glass substrate. Each of the pixel portions 4 has a structure in which a thin film transistor (TFT) 7 exists in a crossing portion of a signal line 6 and a gate line 5. The gate line 5 is connected to a gate terminal of the TFT 7, the signal line 6 is connected to a first terminal, a pixel electrode 8 is connected to a second terminal. Although the first terminal and the second terminal of the TFT will be separately explained, there is no difference between functions of them.

In the display apparatus of the embodiment, it is assumed that there are 720 (=240×RGB) signal lines 6 and there are 320 gate lines 5. A liquid crystal layer 9 is sandwiched between the pixel electrode 8 and a counter electrode 10. The counter electrode 10 is held to a predetermined electric potential by a counter electrode driving circuit (not shown). Although a liquid crystal display apparatus of a general vertical field system will be described here, the invention relates to a driving circuit of the gate lines and can be also applied to all of apparatuses such as liquid crystal display apparatus of a lateral field system and display apparatus of a matrix type such as an organic EL or the like in which an image is displayed by scanning the gate lines.

In the embodiment, the signal line driver 2 is an individual integrated circuit using monosilicon or the like. The signal line driver 2 is directly connected to a terminal portion provided on the glass substrate or is connected to the terminal portion through a flexible substrate or the like. The gate line driver 13 is constructed by a shift register control circuit 3 and a shift register circuit 11. In a manner similar to the signal line driver 2, the shift register control circuit 3 is an individual integrated circuit using monosilicon or the like. The shift register control circuit 3 is directly connected to the terminal portion provided on the glass substrate or is connected to the terminal portion through the flexible substrate or the like.

The shift register circuit 11 is constructed by using a plurality of MOS transistors each having a structure similar to that of the TFT 7 and is formed on the glass substrate simultaneously with the display unit 1. A shift register control signal group 12 is outputted from the shift register control circuit 3 toward the shift register circuit 11.

Although the signal line driver 2 and the shift register control circuit 3 are individually illustrated in FIG. 1, there is also considered a case of using a driver IC of one chip in which the functions of the signal line driver 2 and the shift register control circuit 3 are integrated to one IC.

In the case of the embodiment, although a semiconductor layer of each of the MOS transistors constructing the TFTs and a gate line selecting circuit is made of amorphous silicon (a-Si), the invention can be also similarly applied to other transistors such as organic TFTs or the like having problems similar to those in the invention.

Figure 2:
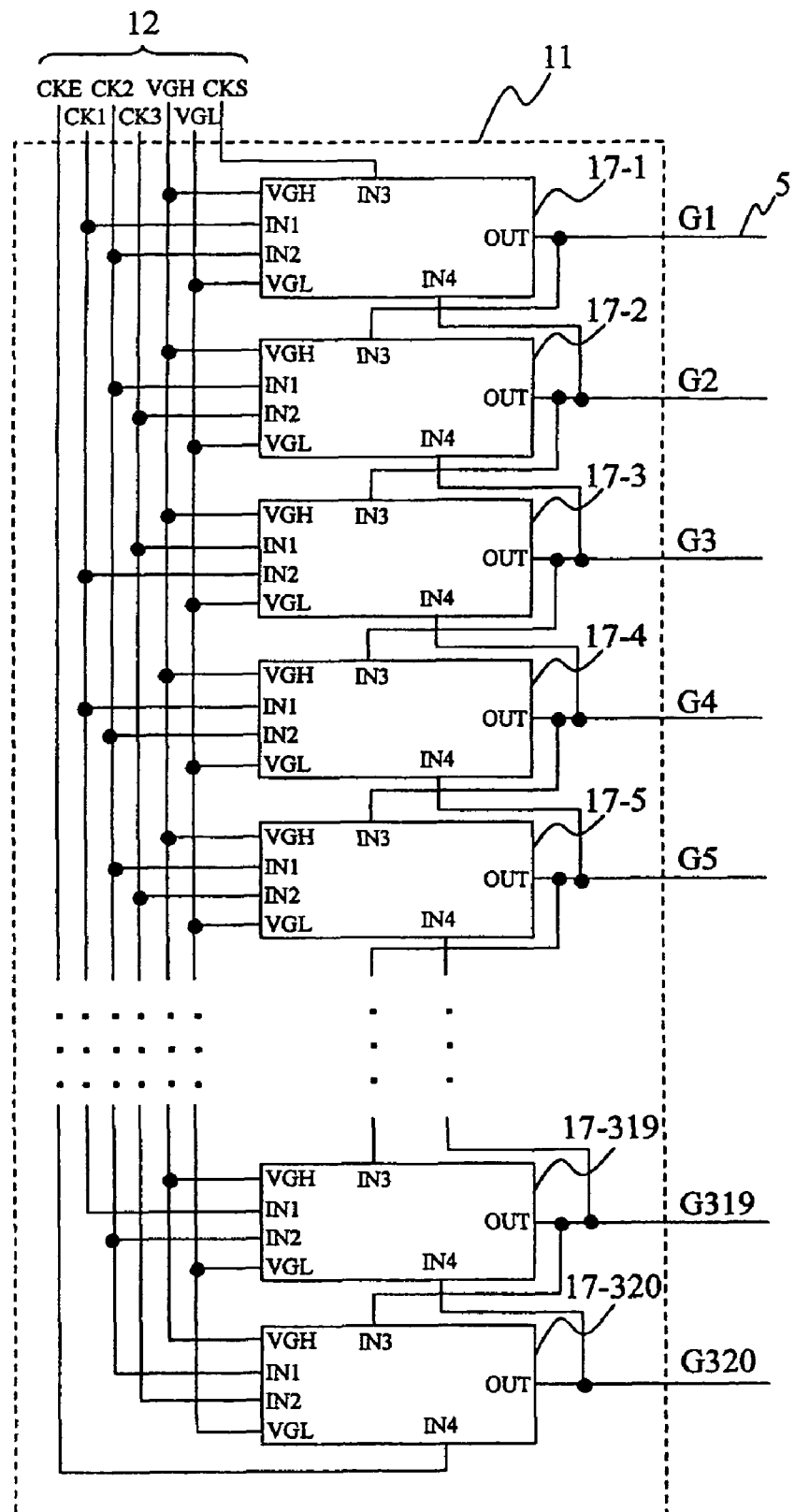
FIG. 2 is a block diagram of a shift register circuit 11 shown in FIG. 1.

FIG. 2 is a block diagram of the shift register circuit 11 shown in FIG. 1. The shift register circuit 11 is constructed by connecting a plurality of fundamental circuits 17. The fundamental circuit which drives a first gate line G1 is assumed to be a fundamental circuit 17-1, the fundamental circuit which drives a second gate line G2 is assumed to be a fundamental circuit 17-2, . . . . In this manner, the fundamental circuits are similarly connected to all of the gate lines. Since the number of gate lines of the display apparatus of the embodiment is equal to 320, the 320 fundamental circuits 17-1 to 17-320 also exist. Each of the fundamental circuits has input terminals IN1, IN2, IN3, IN4, VGL, and VGH and an output terminal OUT.

The shift register control signal group 12 which is inputted to the shift register circuit 11 is constructed by the following seven signals: fundamental clocks CK1 to CK3 having three different phases; an auxiliary pulse CKS and an auxiliary pulse CKE as auxiliary signals; a high-level voltage VGH; and a low-level voltage VGL.

The fundamental clock CK1 is connected to the first input terminal IN1 of the fundamental circuit 17-1. The fundamental clock CK2 is connected to the first input terminal IN1 of the fundamental circuit 17-2. The fundamental clock CK3 is connected to the first input terminal IN1 of the fundamental circuit 17-3. The fundamental clock CK1 is connected to the first input terminal IN1 of the fundamental circuit 17-4. In this manner, the fundamental clocks are sequentially connected to the first input terminals IN1.

The clock CK2 is inputted to the second input terminal IN2 of the fundamental circuit 17-1. The clock CK3 is inputted to the second input terminal IN2 of the fundamental circuit 17-2. The clock CK1 is inputted to the second input terminal IN2 of the fundamental circuit 17-3. In this manner, when the clock which is inputted to the first input terminal IN1 of each fundamental circuit is assumed to be the ith fundamental clock $CK_i$, the clock $CK_{i+1}$ is inputted to the second input terminal IN2. However, if (i=3), the clock CK1 is inputted to IN2.

The third input terminal IN3 is connected to the output terminal OUT of the fundamental circuit of the front stage except for the first fundamental circuit 17-1. The pulse CKS is inputted to the fundamental circuit 17-1.

The fourth input terminal IN4 is connected to the output terminal OUT of the fundamental circuit of the next stage except for the 320th fundamental circuit 17-320. The pulse CKE is inputted to the fundamental circuit 17-320.

The high-level voltage VGH is connected to the VGH input terminals in common with respect to all of the fundamental circuits. Likewise, the low-level voltage VGL is connected to the VGL input terminals in common with respect to all of the fundamental circuits.

As mentioned above, the output terminal OUT is connected to the neighboring fundamental circuits and connected to the corresponding gate line 5, respectively.

Figure 3:
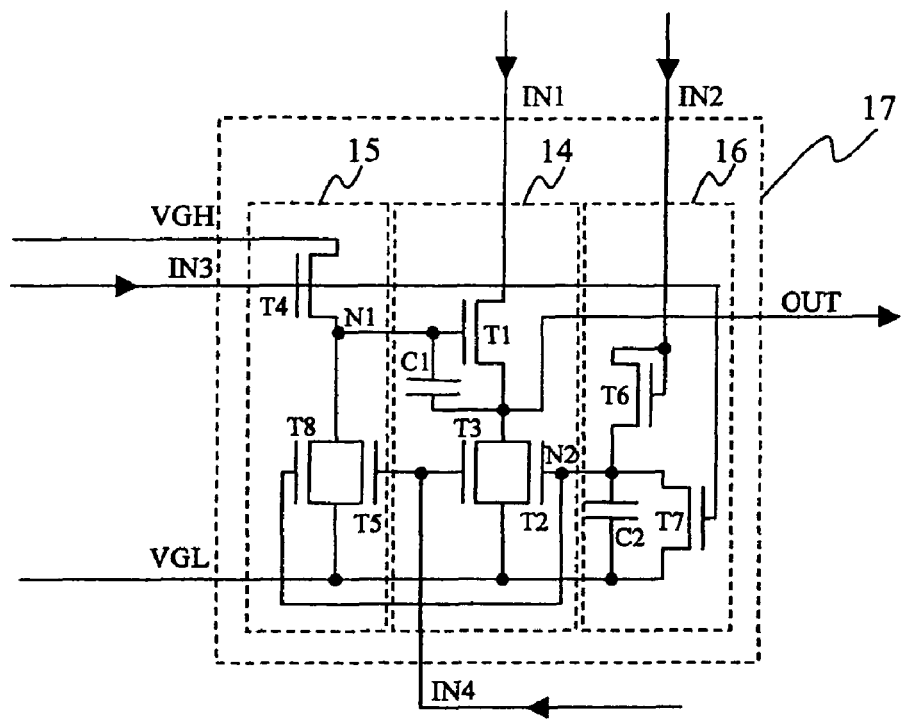
FIG. 3 is a fundamental circuit diagram of the shift register circuit 11 shown in FIG. 2.

FIG. 3 is a diagram showing a circuit construction of the fundamental circuit in FIG. 2. The fundamental circuit 17 is constructed by a gate line driving circuit 14, a timing control circuit 15, and a holding device control circuit 16.

The gate line driving circuit 14 is constructed by a gate line charging device T1, a gate line holding device T2, a gate line discharging device T3, and a capacitor C1.

A first terminal of the gate line charging device T1 is connected to the first input terminal IN1, a gate terminal is connected to a first terminal of the capacitor C1 and a node N1, and a second terminal is connected to a first terminal of the gate line holding device T2, a first terminal of the gate line discharging device T3, a second terminal of the capacitor C1, and the output terminal OUT.

A gate terminal of the gate line holding device T2 is connected to a node N2 and a second terminal is connected to the low-level voltage VGL.

A gate terminal of the gate line discharging device T3 is connected to the fourth input terminal IN4 and a second terminal is connected to the low-level voltage VGL.

The timing control circuit 15 is constructed by a GDC charging device T4, a GDC discharging device T5, and a GDC holding device T8.

A first terminal of the GDC charging device T4 is connected to the input terminal VGH of the high-level voltage, a gate terminal is connected to the third input terminal IN3, and a second terminal is connected to the node N1.

A first terminal of the GDC discharging device T5 is connected to the node N1, a gate terminal is connected to the fourth input terminal IN4, and a second terminal is connected to the input terminal VGL of the low-level voltage.

A first terminal of the GDC holding device T8 is connected to the node N1, a gate terminal is connected to the node N2, and a second terminal is connected to the input terminal VGL of the low-level voltage.

The holding device control circuit 16 is constructed by a setting device T6, a resetting device T7, and a holding capacitor C2.

A first terminal and a gate terminal of the setting device T6 are connected to the second input terminal IN2 and a second terminal is connected to the node N2, a first terminal of the resetting device T7, and a first terminal of the holding capacitor C2.

A gate terminal of the resetting device T7 is connected to the third input terminal IN3 and a second terminal is connected to the input terminal VGL of the low-level voltage. A second terminal of the holding capacitor C2 is connected to the input terminal VGL of the low-level voltage.

Although explanation will be made hereinbelow on the assumption that each MOS transistor is an n-type transistor, even if a p-type transistor is used, the circuit can be easily designed by using means similar to that of the invention. In the following description, Vth(Ta) denotes a threshold voltage of an MOS transistor Ta (a is an integer of 1 to 8).

First, prior to explaining the operation of the whole shift register circuit, the operation of only the holding device control circuit 16 will be described with reference to FIGS. 4 and 5.

Figure 4:
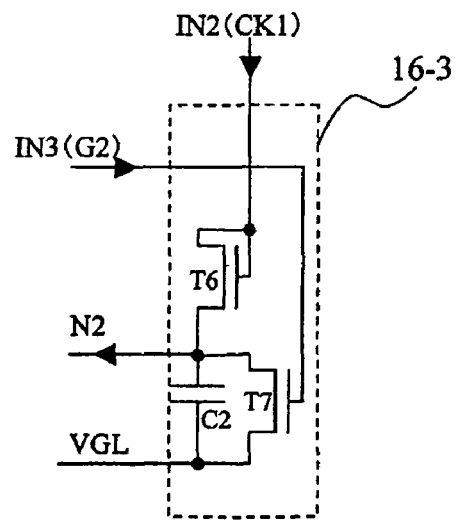
FIG. 4 is a circuit diagram of a holding device control circuit 16 shown in FIG. 3.

FIG. 4 is a circuit diagram of the holding device control circuit 16 shown in FIG. 3. As an example of the operation explanation, a holding device control circuit 16-3 included in the fundamental circuit 17-3 corresponding to the third gate line G3 is shown in FIG. 4. As shown in FIG. 2, the clock CK1 is connected to the second input terminal IN2 of the fundamental circuit 17-3 and an output G2 of the front stage is connected to the third input terminal IN3. The node N2 corresponds to the output of the holding device control circuit 16.

The operation of the holding device control circuit 16-3 shown in FIG. 4 will be described with reference to a timing chart of FIG. 5. Among the inputs and output of the fundamental circuit 17-3, waveforms of the second input terminal IN2 and the third input terminal IN3 are shown as two inputs regarding the holding device control circuit 16-3 and a waveform of the node N2 corresponding to the output is shown in FIG. 5.

Figure 5:
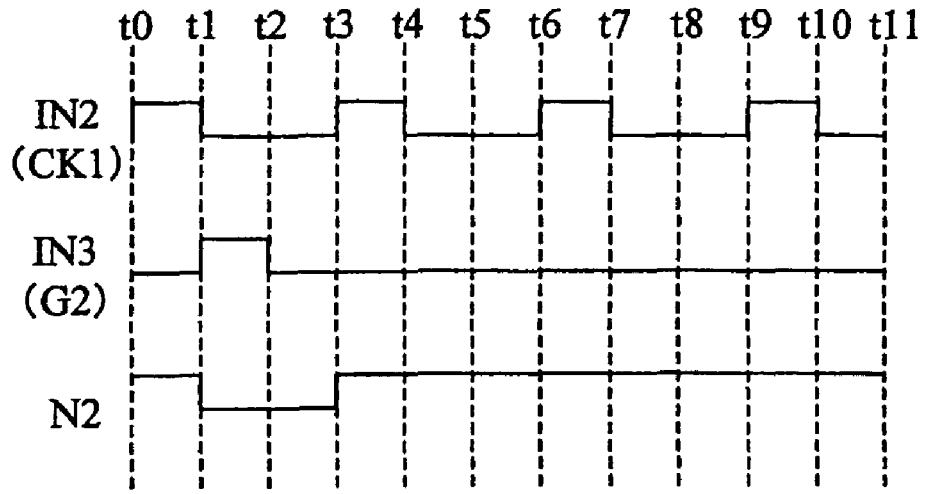
FIG. 5 is a timing chart corresponding to FIG. 4.

The first fundamental clock CK1 which is inputted to the second input terminal IN2 is one of the fundamental clocks of three phases and has the waveform which rises at time t0, t3, t6, t9, . . . and trails at time t1, t4, t7, t10, . . . shown in FIG. 5.

The third input IN3 connected to the second gate line G2 has the waveform which rises at time t1 and trails at time t2.

The voltage of the node N2 corresponding to the output of the holding device control circuit 16 is mostly at the H level. This is because each time the fundamental clock CK1 connected to the second input terminal IN2 is set to the H level, the voltage of the node N2 becomes almost (VGH−Vth(T6)) through the setting device T6 which has been diode-connected and this voltage is held by the holding capacitor C2.

While the second input terminal IN2 is at the L level, the setting device T6 is in the OFF state and the node N2 is held at the H level owing to the operation of the holding capacitor C2. Since the state is held by the holding capacitor C2, if the time during which the second input terminal IN2 is at the L level is long, a decrease in output-occurs due to a leakage current. However, as will be understood from FIG. 5, since such a period of time is equal to a time corresponding to two clocks at most, no problem occurs.

The voltage of the node N2 is set to the L level when the H-level signal is inputted to the third input terminal IN3. When the third input terminal IN3 is set to the H level, the resetting device T7 is turned on, thereby connecting the node N2 and the low-level voltage VGL. At this time, since the fundamental clock CK1 which is inputted to the second input terminal IN2 is at the L level, the setting device T6 is OFF. Therefore, the voltage of the node N2 is equal to almost VGL. Even after the third input terminal IN3 is set to the L level, such a state is continued until the second input-terminal IN2 is subsequently set to the H level.

As described above, since the holding device control circuit 16 of the invention is constructed in such a manner that the second input terminal IN2 and the third input terminal IN3 are not simultaneously set to the H level, a desired output can be obtained without consuming the unnecessary current.

As for the DC stress, since all of the voltages of three terminals of the setting device T6 are always equal to almost the same value, the DC stress hardly occurs. As for the resetting device T7, although the DC stress occurs when the H-level signal is inputted to the third input terminal IN3, its duty is equal to 1/(the number of gate lines+blanking period) and is ordinarily equal to a very small value of about a fraction of hundreds.

Figure 6:
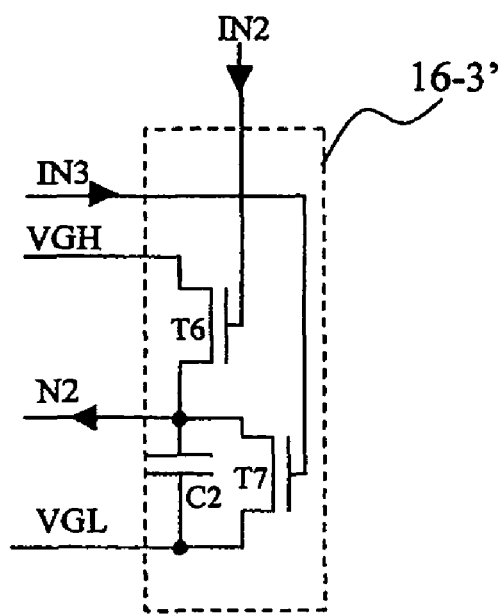
FIG. 6 is a circuit diagram showing another embodiment of the holding device control circuit 16 shown in FIG. 3.

FIG. 6 shows another embodiment of the holding device control circuit 16. An operation principle, an output waveform, and the like of the holding device control circuit 16 of FIG. 6 are substantially the same as those shown in FIGS. 4 and 5 except that the connecting destination of the first terminal of the setting device T6 is merely changed from the second input IN2 to the high-level voltage VGH.

Figure 7:
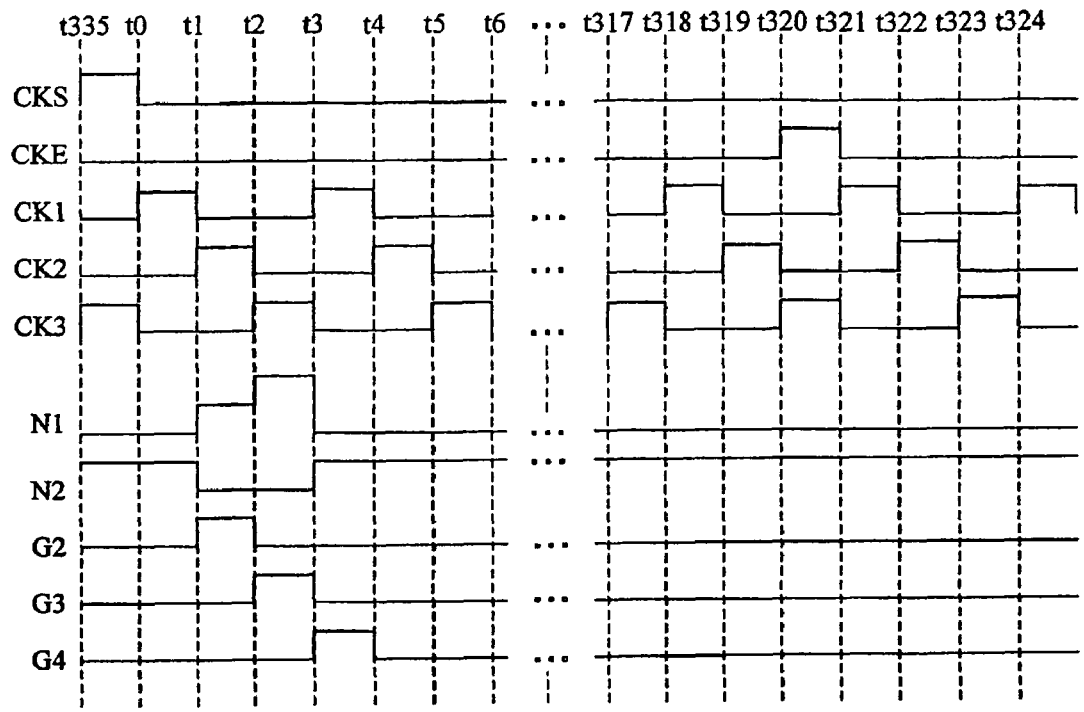
FIG. 7 is a timing chart corresponding to FIG. 3.

The operation of the whole shift register circuit will now be described with reference to a timing chart of FIG. 7. As an example of the operation, the waveforms of the nodes N1 and N2 in the fundamental circuit 17-3 connected to the third gate line G3 and a waveform of the output OUT are shown.

As shown in FIG. 2, the clock CK3 is connected to the first input terminal IN1 of the fundamental circuit 17-3, the clock CK1 is connected to the second input terminal IN2, the output terminal OUT (G2) of the fundamental circuit 17-2 of the front stage is connected to the third input terminal IN3, and the output terminal OUT (G4) of the fundamental circuit 17-4 of the post stage is connected to the fourth input terminal IN4, respectively.

In the display apparatus of the invention, the number of gate lines is equal to 320 and the blanking period is equal to a time corresponding to the 16 gate lines. Therefore, a period of time from t0 to t319 shown in FIG. 7 is a scanning period and a period of time from t320 to t335 is a blanking period. One scanning period is started from time t0 shown in FIG. 7.

The fundamental clock CK1 connected to the second input terminal IN2 of the fundamental circuit 17-3 is set to the high level at time t0. Thus, the diode-connected setting device T6 is turned on, the voltage of the node N2 becomes almost (VGH−Vth(T6)), and the gate line holding device T2 and the GDC holding device T8 are turned on. When the gate line holding device T2 is turned on, the output terminal OUT is connected to the low-level voltage input terminal VGL and the voltage of the output terminal OUT becomes VGL. Similarly, when the GDC holding device T8 is turned on, the node N1 is connected to the low-level voltage input terminal VGL and the voltage of the node N1 becomes VGL.

The output G2 of the gate line of the front stage is set to the H level at next time t1, so that the resetting device T7 is turned on. Since the resetting device T7 is turned on, the node N2 is connected to the low-level voltage VGL and the voltage of the node N2 is set to the L level. Thus, the gate line holding device T2 is turned off. At this time, the output terminal OUT is connected to the first input IN1 through the gate line charging device T1 in the ON state. In this instance, since the clock CK3 connected to the first input IN1 is at the L level, the output terminal OUT is set to the L level. At the same time, the GDC holding device T8 is also turned off and the GDC charging device T4 is turned on. At this time, the voltage of the node N1 becomes (VGH−Vth(T4)), the capacitor C1 is charged to this voltage, and the gate line charging device T1 is turned on.

The clock CK3 connected at the first input IN1 is set to the H level at next time t2. In this instance, the voltage of the node N1 is set to a voltage value as shown by the following equation (1) by the capacitive coupling using the capacitor C1.

$$(VGH-Vth(T4))+VGH(CB/(CB+CS)) \qquad (1)$$

where,
CB: capacitance value of C1
CS: capacitance value of a parasitic capacitor As a parasitic capacitor, for example, there is a parasitic capacitor of the GDC charging device T4, GDC discharging device T5, and GDC holding device T8. If the capacitance value CB of the capacitor C1 is set to a value in which the voltage drop due to the threshold value can be covered in consideration of the parasitic capacitor CS, the voltage of the gate terminal of the gate line charging device T1 is higher than the value of VGH and the VGH voltage is outputted to the output terminal OUT (G3).

The output terminal G4 of the next stage is set to the H level at next time t3 and inputted to the fourth input terminal IN4. Thus, the gate line discharging device T3 is turned on, connects the output terminal OUT at the H level and the low-level voltage VGL, and functions so as to decrease the voltage of the output terminal OUT to the L level. At the same time, the GDC discharging device T5 is turned on, the voltage of the node N1 is decreased to the L level, and the gate line charging device T1 is turned off.

At time t3, CK1 connected to the second input IN2 is also simultaneously set to the H level and, as already described above, the node N2 is set to the H level. Thus, the gate line holding device T2 is turned on and connects the output terminal OUT and the low-level voltage input VGL. In this manner, the gate line output terminal OUT is set to the VGL level by the gate line discharging device T3 and the gate line holding device T2. At the same time, the GDC holding device T8 is turned on and connects the node N1 and the low-level voltage input VGL. In this manner, the node N1 is set to the VGL level by the GDC discharging device T5 and the GDC holding device T8 and output terminal OUT is held at the L level until the third input terminal IN3 is subsequently set to the H level.

The output terminal G4 of the next stage is set to the L level at next time t4 and the fourth input terminal IN4 is also set to the L level. Therefore, both of the gate line discharging device T3 and the GDC discharging device T5 are turned off. Thus, the duty of the DC stress which is applied to the gate line discharging device T3 and the GDC discharging device T5 is equal to up to 1/336, so that the threshold shift can be suppressed. Even if the gate line discharging device T3 and the GDC discharging device T5 are turned off, since the node N2 is still at the H level, the gate line holding device T2 is held in the ON state and contributes to the stabilization of the L level of the gate line. The node N2 is held at the H level for a period of time until the third input terminal IN3 is subsequently set to the H level. In a manner similar to the above, since the GDC holding device T8 is also ON state, the node N1 is stably held at the L level. After that, the operation similar to that mentioned above is repeated and the scan progresses.

With respect to the third input terminal IN3 in the fundamental circuit 17-1 connected to the first gate line G1 shown in FIG. 2, since the gate line of the front stage does not exist, the auxiliary pulse CKS is connected. The auxiliary pulse CKS has a waveform which rises at time t335 and trails at t0. Similarly, in the fourth input terminal IN4 in the fundamental circuit 17-320 connected to the 320th gate line G320, since the gate line of the post stage does not exist, the auxiliary pulse CKE is connected. The auxiliary pulse CKE has a waveform which rises at time t320 and trails at t321.

The gate line discharging device T3 shown in FIG. 3 has to promptly decrease the gate line at the H level to the L level. For this purpose, powerful driving ability is needed. In such a device, the deterioration of the performance due to the progress of the threshold shift has to be avoided as much as possible. Since the duty of the DC stress of the gate line discharging device T3 in the embodiment is so small to be equal to 1/336, such deterioration can be prevented. Although the duty of the DC stress of the gate line holding device T2 is equal to almost 1, since the gate line holding device T2 has a role of holding the state where the voltage has been reduced to the L level by the gate line discharging device T3, the deterioration of the performance due to the threshold shift is permitted to a certain extent. This is true of the GDC discharging device T5 and the GDC holding device T8.

Figure 8:
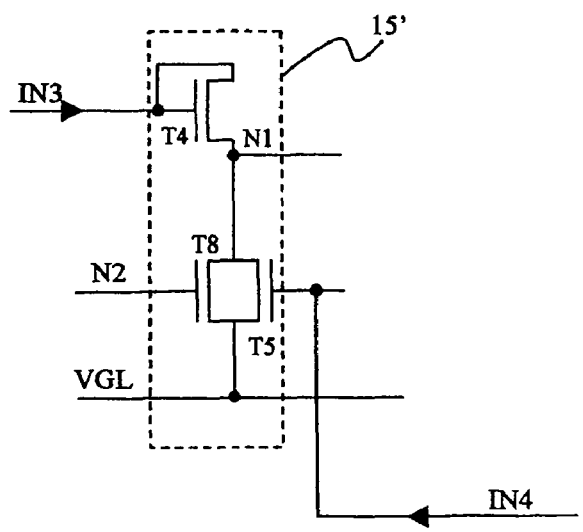
FIG. 8 is a circuit diagram showing another embodiment of a timing control circuit 15 shown in FIG. 3.

FIG. 8 shows another embodiment of the timing control circuit 15 shown in FIG. 3. In FIG. 3, the first terminal of the GDC charging device T4 connected to the high-level voltage VGH is connected to the first input terminal IN1 in a manner similar to the gate terminal. Since an operation principle, output waveforms, and the like are substantially the same as those described in FIGS. 3 and 7, their explanation is, omitted here.

Embodiment 2

Figure 9:
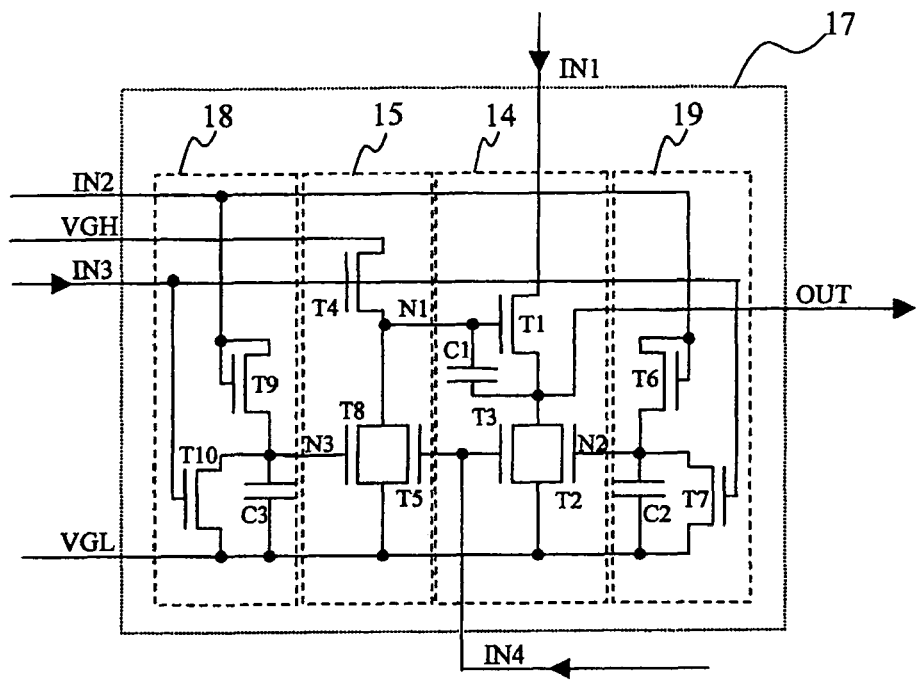
FIG. 9 is a circuit diagram showing another fundamental circuit of the shift register circuit according to the invention.

In the example shown in FIG. 3, the gate line holding device T2 and the GDC holding device T8 are controlled by using one holding device control circuit 16. However, as shown in FIG. 9, it is also possible to construct the holding device control circuit 16 by two control circuits such as first and second holding device control circuits; that is, a gate line holding device control circuit 19 for controlling the gate line holding device T2; and a GDC holding device control circuit 18 for controlling the GDC holding device T8. Since each of the gate line holding device control circuit 19 and the GDC holding device control circuit 18 has a structure and an operation principle similar to those of the holding device control circuit 16-3 or a holding device control circuit 16-3' shown in FIG. 4 or 6, their detailed explanation is omitted here.

Embodiment 3

In the fundamental circuit 17 shown in FIG. 3, the GDC holding device T8 is turned by such a procedure that the third input terminal IN3 is set to the H level, the resetting device T7 is turned on, so that the charges in the holding capacitor C2 are discharged, and the GDC holding device T8 is turned off. However, to turn on the GDC charging device T4, it is sufficient that the third input terminal IN3 is set to the H level. Therefore, such a situation that before the GDC holding device T8 is set to the sufficient OFF state, the GDC charging device T4 is turned on is considered. If such a state occurred, the current flows momentarily from the high-level voltage VGH toward the low-level voltage VGL, so that it is undesirable. To certainly prevent such a situation, it is necessary that the GDC holding device T8 has certainly been set to the OFF state before the GDC charging device T4 is turned on. An embodiment in such a case will be shown below.

Figure 10:
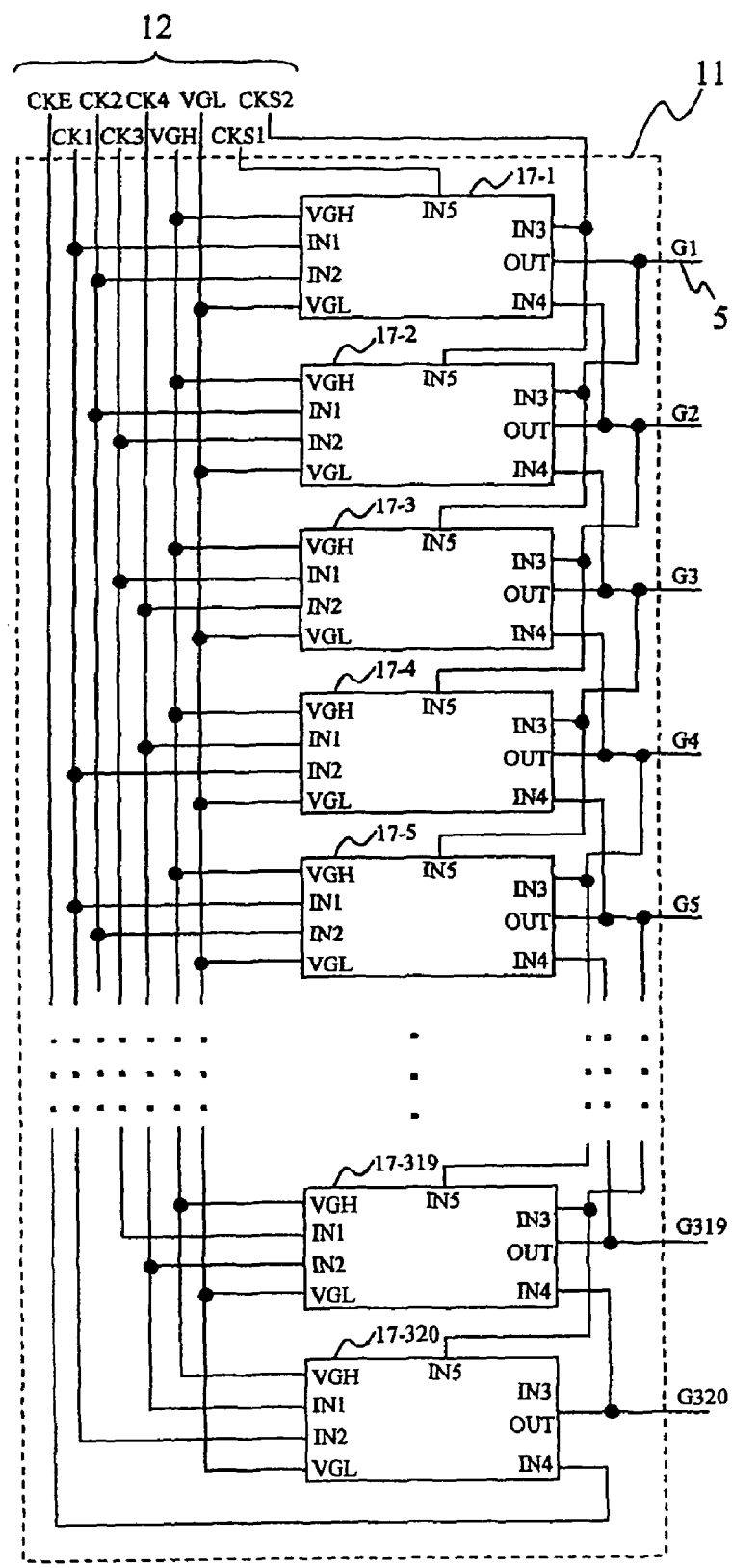
FIG. 10 is a block diagram showing another embodiment of the shift register circuit according to the invention.

FIG. 10 is a block diagram showing another embodiment of the shift register circuit. The shift register circuit 11 is constructed by connecting a plurality of fundamental circuits 17. In a manner similar to the foregoing embodiments, the fundamental circuits 17-1 to 17-320 exist. Each of the fundamental circuits has the input terminals IN1, IN2, IN3, IN4, and IN5, the low-level voltage VGL, the high-level voltage VGH, and the output terminal OUT.

The shift register control signal group 12 which is inputted to the shift register circuit 11 is constructed by the following nine signals: fundamental clocks CK1 to CK4 having four different phases; an auxiliary pulse CKS1, an auxiliary pulse CKS2, and the auxiliary pulse CKE as auxiliary signals; the high-level voltage VGH; and the low-level voltage VGL.

The clock CK1 is connected to the first input terminal IN1 of the fundamental circuit 17-1. The clock CK2 is connected to the input terminal IN1 of the fundamental circuit 17-2. The clock CK3 is connected to the input terminal IN1 of the fundamental circuit 17-3. The clock CK4 is connected to the input terminal IN1 of the fundamental circuit 17-4. The clock CK1 is connected to the input terminal IN1 of the fundamental circuit 17-5. In this manner, the first input terminals IN1 are sequentially connected to the clocks.

The clock CK2 is inputted to the second input terminal IN2 of the fundamental circuit 17-1. The clock CK3 is inputted to the IN2 of the fundamental circuit 17-2. The clock CK4 is inputted to the IN2 of the fundamental circuit 17-3. The clock CK1 is inputted to the IN2 of the fundamental circuit 17-4. In this manner, when the clock which is inputted to the first input terminal IN1 of each fundamental circuit is assumed to be the ith fundamental clock $CK_i$, the clock $CK_{i+1}$ is inputted to the second input terminal IN2. However, if (i=4), the clock CK1 is inputted to the second input terminal IN2.

The third input terminal IN3 is connected to the output terminal OUT of the fundamental circuit of the front stage except for the first fundamental circuit 17-1. The pulse CKS2 is inputted to the fundamental circuit 17-1.

The fourth input terminal IN4 is connected to the output terminal OUT of the fundamental circuit of the next stage except for the 320th fundamental circuit 17-320. The pulse CKE is inputted to the fundamental circuit 17-320.

The fifth input terminal IN5 is connected to the output terminal OUT of the fundamental circuit of two stages before except for the first fundamental circuit 17-1 and the second fundamental circuit 17-2. The auxiliary pulse CKS1 is inputted to the fundamental circuit 17-1. The auxiliary pulse CKS2 is inputted to the fundamental circuit 17-2.

The high-level voltage VGH is inputted to the VGH input terminals and the low-level voltage VGL is inputted to the VGL input terminals in common with respect to all of the fundamental circuits.

As mentioned above, the output terminal OUT is connected to the neighboring fundamental circuits and connected to the gate line 5.

Figure 11:
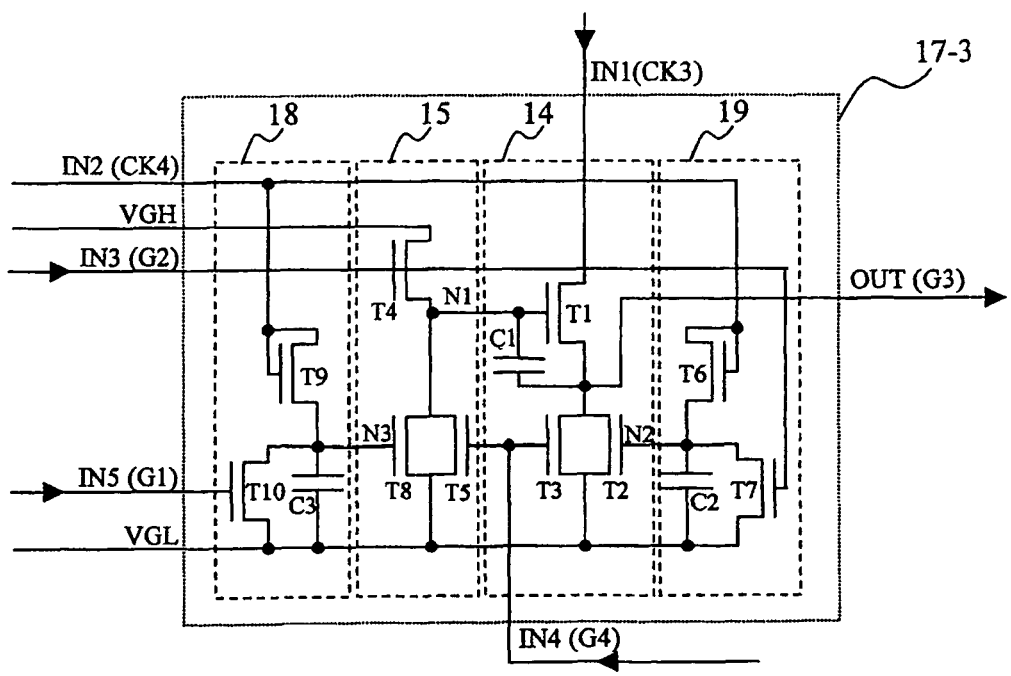
FIG. 11 is a fundamental circuit diagram of the shift register circuit 11 shown in FIG. 10.

FIG. 11 is a diagram showing a circuit construction of the fundamental circuit in FIG. 10. The fundamental circuit 17 is constructed by the gate line driving circuit 14, timing control circuit 15, gate line holding device control circuit 19, and GDC holding device control circuit 18.

The gate line driving circuit 14 is constructed by the gate line charging device T1, gate line holding device T2, gate line discharging device T3, and capacitor C1.

The first terminal of the gate line charging device T1 is connected to the first input terminal IN1, the gate terminal is connected to the first terminal of the capacitor C1 and the node N1, and the second terminal is connected to the first terminal of the gate line holding device T2, the first terminal of the gate line discharging device T3, the second terminal of the capacitor C1, and the output terminal OUT.

The gate terminal of the gate line holding device T2 is connected to the node N2 and the second terminal is connected to the low-level voltage VGL.

The gate terminal of the gate line discharging device T3 is connected to the fourth input terminal IN4 and the second terminal is connected to the low-level voltage VGL.

The timing control circuit 15 is constructed by the GDC charging device T4, GDC discharging device T5, and GDC holding device T8.

The first terminal of the GDC charging device T4 is connected to the input terminal VGH of the high-level voltage, the gate terminal is connected to the third input terminal IN3, and the second terminal is connected to the node N1, the first terminal of the GDC discharging device T5, and the first terminal of the GDC holding device T8.

The gate terminal of the GDC discharging device T5 is connected to the fourth input terminal IN4 and the second terminal is connected to the input terminal VGL of the low-level voltage.

The gate terminal of the GDC holding device T8 is connected to the node N3 and the second terminal is connected to the input terminal VGL of the low-level voltage.

The gate line holding device control circuit 19 is constructed by the setting device T6, resetting device T7, and holding capacitor C2.

The first terminal and the gate terminal of the setting device T6 are connected to the second input terminal IN2 and the second terminal is connected to the node N2, the first terminal of the resetting device T7, and the first terminal of the holding capacitor C2.

The gate terminal of the resetting device T7 is connected to the third input terminal IN3 and the second terminal is connected to the input terminal VGL of the low-level voltage.

A second terminal of the holding capacitor C2 is connected to the input terminal VGL of the low-level voltage.

The GDC holding device control circuit 18 is constructed by a setting device T9, a resetting device T10, and a holding capacitor C3.

A first terminal and a gate terminal of the setting device T9 are connected to the second input terminal IN2 and a second terminal is connected to the node N3, a first terminal of the resetting device T10, and a first terminal of the holding capacitor C3.

A gate terminal of the resetting device T10 is connected to the fifth input terminal IN5 and a second terminal is connected to the input terminal VGL of the low-level voltage.

A second terminal of the holding capacitor C3 is connected to the input terminal VGL of the low-level voltage.

The operation of the fundamental circuit 17 shown in FIG. 11 will be described with reference to a timing chart of FIG. 12. As an example of the operation, waveforms of the nodes N1, N2, and N3 and the output OUT in the fundamental circuit 17-3 connected to the third gate line G3 shown in FIG. 10 are shown.

As shown in FIG. 11, the clock CK3 is inputted to the first input terminal IN1 of the fundamental circuit 17-3, the clock CK4 is inputted to the second input terminal IN2, the output terminal OUT (G2) of the fundamental circuit 17-2 of the front stage is connected to the third input terminal IN3, the output terminal OUT (G4) of the fundamental circuit 17-4 of the post stage is connected to the fourth input terminal IN4, and the output terminal OUT (G1) of the fundamental circuit 17-1 of two stages before is connected to the fifth input terminal IN5, respectively.

Figure 12:
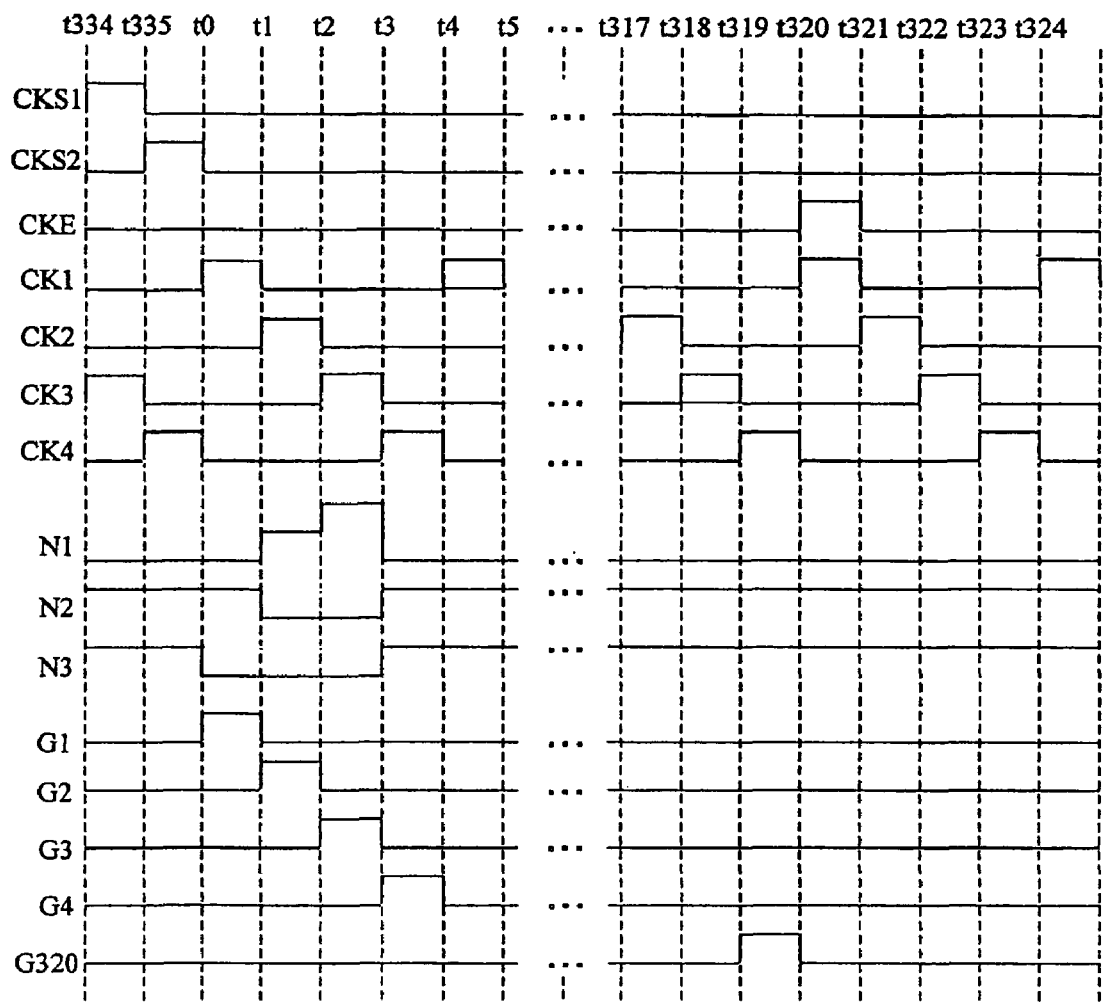
FIG. 12 is a timing chart corresponding to FIG. 11.

One scanning period is started from time t0 shown in FIG. 12. For a period of time until time t0, the node N3 is stably held at the H level owing to the operation of the GDC holding device control circuit 18. Since the node N3 is at the H level, the GDC holding device T8 is ON state and the node N1 is stably held at the L level. Similarly, since the node N2 is stably held at the H level owing to the operation of the gate line holding device control circuit 19, the gate line holding device T2 is ON state and the output OUT is stably held at the L level.

Subsequently, the output of the first gate line G1 is set to the H level at time t0. Since the fifth input terminal IN5 of the fundamental circuit 17-3 corresponding to the third gate line G3 is connected to the gate line G1, the resetting device T10 in the GDC holding device control circuit 18 is turned on. Since the resetting device T10 is turned on, the node N3 is connected to the low-level voltage VGL and the voltage of the node N3 becomes almost VGL, thereby turning off the GDC holding device T8.

The output G2 of the gate line of the front stage is set to the H level at next time t1, thereby turning on the GDC charging device T4. Thus, the voltage of the node N1 becomes (VGH−Vth(T4)), the capacitor C1 is charged to this voltage, and the gate line charging device T1 is turned on. At the same time, the resetting device T7 in the gate line holding device control circuit 19 is also turned on. Since the resetting device T7 is turned on, the node N2 is connected to the low-level voltage VGL and the voltage of the node N2 becomes almost VGL, thereby turning off the gate line holding device T2. At this time, the output terminal OUT is connected to the first input IN1 through the gate line charging device T1 in the ON state. In this instance, the clock CK3 connected to the first input IN1 is at the L level, the output terminal OUT is set to the L level.

The clock CK3 is set to the H level at next time t2. At this time, the voltage of the node N1 is set to the voltage value as shown by the following equation (1).

$$(VGH-Vth(T4))+VGH(CB/(CB+CS)) \qquad (1)$$

The output terminal G4 of the next stage is set to the H level at next time t3 and inputted to the fourth input terminal IN4. Thus, the gate line discharging device T3 is turned on, connects the output terminal OUT at the H level and the low-level voltage VGL, and functions so as to decrease the voltage of the output terminal OUT to the L level. At the same time, the GDC discharging device T5 whose fourth input terminal IN4 has been connected to the gate terminal is turned on, the voltage of the node N1 is decreased to the VGL level, and the gate line charging device T1 is turned off.

At time t3, CK4 connected to the second input IN2 is also simultaneously set to the H level and, as already described above, the node N2 is also set to the H level. Thus, the gate line holding device T2 is turned on and connects the output terminal OUT and the low-level voltage VGL. Similarly, the node N3 is also set to the H level and the GDC holding device T8 is turned on and connects the node N1 and the low-level voltage VGL. The gate line output OUT is set to the VGL level by the gate line discharging device T3 and the gate line holding device T2. The node N1 is also set to the VGL level by the GDC discharging device T5 and the GDC holding device T8. Subsequently, the node N1 and the output terminal OUT stably keep the L level until the third input terminal IN3 is set to the H level. Since the subsequent operation is substantially the same as that mentioned above, its explanation is omitted.

As described above, by using the output of the fundamental circuit of two stages before, the GDC holding device T8 can be certainly turned off before the GDC charging device T4 is turned on. The generation of the through-current can be prevented.

Embodiment 4

The embodiment has been described above with respect to the case where the shift register circuit is arranged on one side of the display unit. The embodiment 4 will now be explained with respect to an example in which the shift register circuits are arranged on both sides of the display unit.

Figure 13:
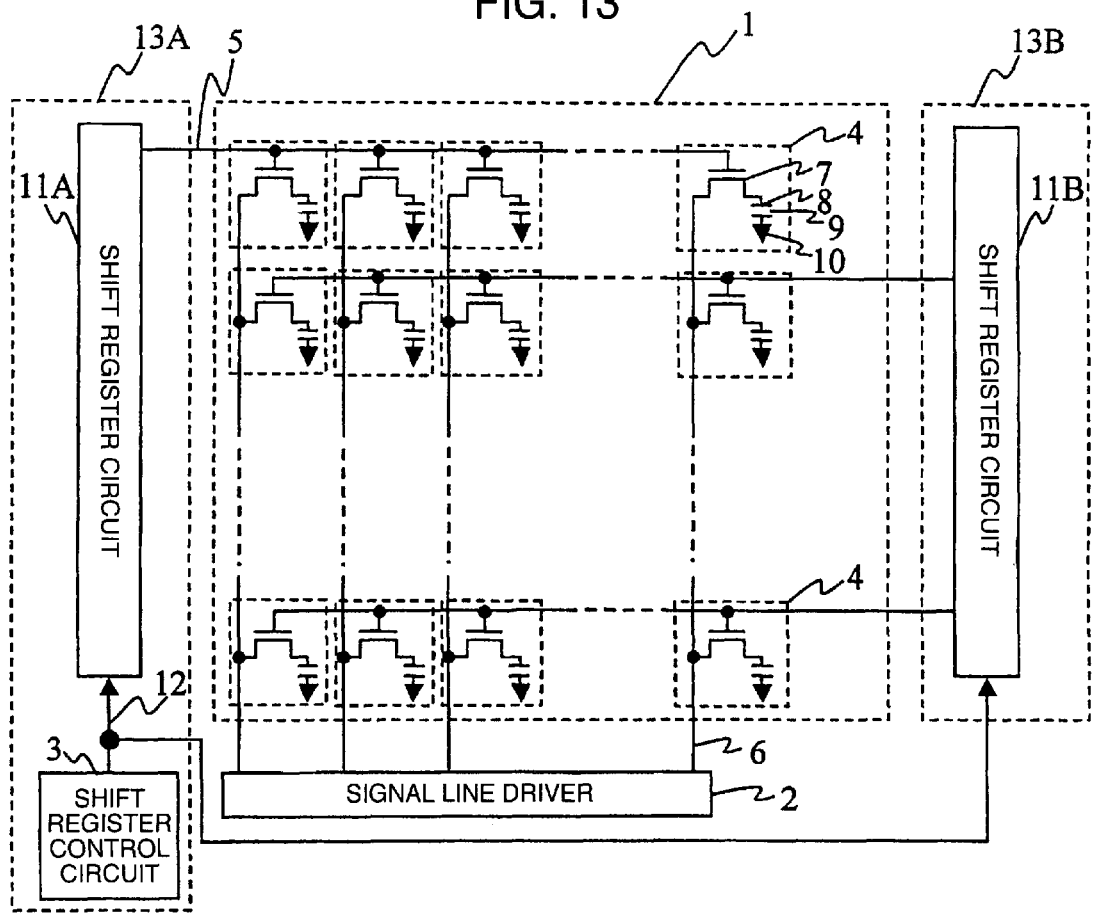
FIG. 13 is a whole schematic diagram of another embodiment of the display apparatus according to the invention.

FIG. 13 shows a schematic diagram of a display apparatus in such a case. The display apparatus is constructed by the display unit 1, signal line driver 2, and gate line driver 13. The gate line driver 13 is constructed by a shift register circuit 11A provided on one side of the display unit 1, a shift register circuit 11B provided on the other side of the display unit 1, and the shift register control circuit 3.

The shift register circuit 11A is constructed so as to drive the odd-number lines and the shift register circuit 11B is constructed so as to drive the even-number lines. By constructing in this manner, a width of layout in the signal line direction of the circuit which is formed on the glass substrate can be widened and a degree of freedom of the layout is improved. The above construction can be also used for reduction in width of layout in the scanning direction.

Although the signal line driver 2 and the shift register control circuit 3 are individually illustrated in FIG. 13, there is also considered a case of using the driver IC of one chip in which the functions of the signal line driver 2 and the shift register control circuit 3 are integrated to one IC.

Figure 14:
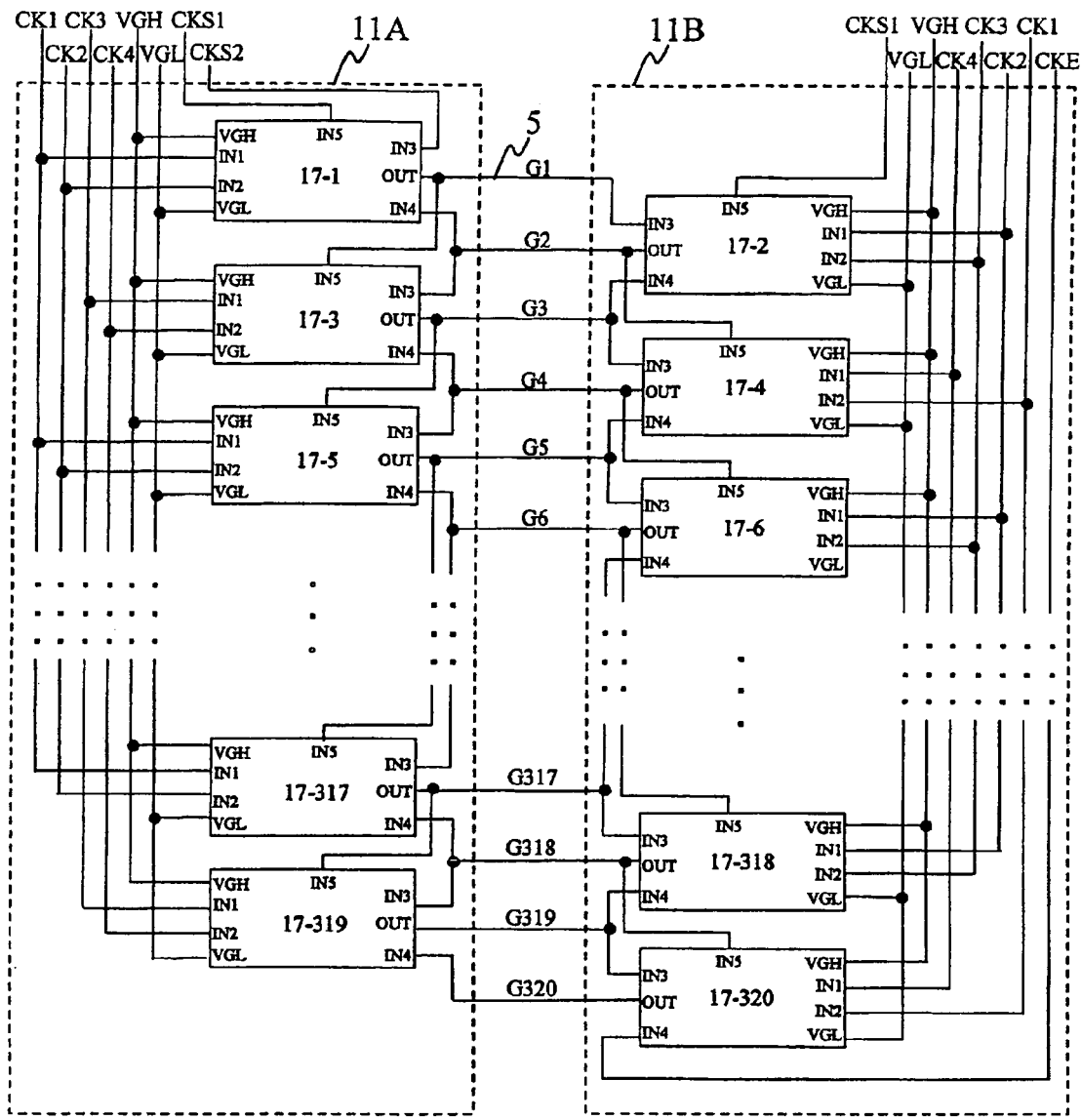
FIG. 14 is a block diagram of shift register circuits 11A and 11B shown in FIG. 13.

FIG. 14 is a block diagram of the shift register circuits 11A and 11B. Since a connecting relation of the fundamental circuits is substantially the same as that shown in FIG. 10, its detailed explanation is omitted here. Since a circuit construction of each fundamental circuit is also substantially the same as that shown in FIG. 10. However, as shown in FIG. 14, there is such an advantage that by arranging the shift register circuits on both sides, the output of the fundamental circuit of two stages before which is inputted to the fifth input terminal IN5 of each fundamental circuit is located just over the self stage, so that its wiring is simplified. The wiring from the output terminal OUT of the fundamental circuit of the front stage which is inputted to the third input terminal IN3 is constructed so as to also perform the function of the gate wiring 5 of the display unit.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A circuit constructed by connecting a plurality of fundamental circuits each comprising a gate line driving circuit, a timing control circuit, a first holding device control circuit, and a second holding device control circuit, wherein:
    said gate line driving circuit comprises a gate line charging device, a gate line discharging device, and a gate line holding device;
    a first terminal of said gate line charging device is connected to a fundamental clock $CK_n$ (n is an integer of 1 to 4);
    a gate terminal of said gate line charging device is connected to an output terminal of said timing control circuit;
    a second terminal of said gate line charging device is connected to a first terminal of said gate line discharging device and a first terminal of said gate line holding device and becomes an output terminal of said fundamental circuit;
    a gate terminal of said gate line discharging device is connected to an output terminal of said fundamental circuit of a post stage and connected to a second auxiliary pulse in said fundamental circuit of a final stage;
    a second terminal of said gate line discharging device is connected to a low-level voltage;
    a gate terminal of said gate line holding device is connected to an output terminal of said first holding device control circuit; and
    a second terminal of said gate line holding device is connected to the low-level voltage, wherein:
    said second holding device control circuit comprises a setting device, a resetting device, and a holding capacitor;
    a first terminal and a gate terminal of said setting device are connected to a fundamental clock $CK_{n+1}$ (n is an integer of 1 to 4; however, when n=4, CK1);
    a second terminal of said setting device is connected to a first terminal of said resetting device and a first terminal of said holding capacitor and becomes an output terminal of said second holding device control circuit;
    a gate terminal of said resetting device is connected to a third auxiliary pulse in said fundamental circuit of a first stage, connected to a first auxiliary pulse in said fundamental circuit of a second stage, and connected to an output terminal of said fundamental circuit of two stages before in said fundamental circuits of a third and subsequent stages;
    a second terminal of said resetting device is connected to the low-level voltage; and
    a second terminal of said holding capacitor is connected to the low-level voltage.

2. A circuit constructed by connecting a plurality of fundamental circuits each comprising a gate line driving circuit, a timing control circuit, a first holding device control circuit, and a second holding device control circuit, wherein:
    said gate line driving circuit comprises a gate line charging device, a gate line discharging device, and a gate line holding device;
    a first terminal of said gate line charging device is connected to a fundamental clock $CK_n$ (n is an integer of 1 to 4),
    a gate terminal of said gate line charging device is connected to an output terminal of said timing control circuit;
    a second terminal of said gate line charging device is connected to a first terminal of said gate line discharging device and a first terminal of said gate line holding device and becomes an output terminal of said fundamental circuit;
    a gate terminal of said gate line discharging device is connected to an output terminal of said fundamental circuit of a post stage and connected to a second auxiliary pulse in said fundamental circuit of a final stage;
    a second terminal of said gate line discharging device is connected to a low-level voltage;
    a gate terminal of said gate line holding device is connected to an output terminal of said first holding device control circuit; and
    a second terminal of said gate line holding device is connected to the low-level voltage, wherein:
    said second holding device control circuit comprises a setting device, a resetting device, and a holding capacitor;
    a first terminal of said setting device is connected to a high-level voltage;
    a gate terminal of said setting device is connected to a fundamental clock $CK_{n+1}$ (n is an integer of 1 to 3; however, when n=3, CK1);
    a second terminal of said setting device is connected to a first terminal of said resetting device and a first terminal of said holding capacitor and becomes an output terminal of said second holding device control circuit;
    a gate terminal of said resetting device is connected to a third auxiliary pulse in said fundamental circuit of a first stage, connected to a first auxiliary pulse in said fundamental circuit of a second stage, and connected to an output terminal of said fundamental circuit of two stages before in said fundamental circuits of a third and subsequent stages;
    a second terminal of said resetting device is connected to the low-level voltage; and
    a second terminal of said holding capacitor is connected to the low-level voltage.

3. A shift register circuit constructed by connecting a plurality of fundamental circuits each comprising a gate line driving circuit, a timing control circuit, a first holding device control circuit, and a second holding device control circuit, wherein:
    said gate line driving circuit has a gate line charging device, a gate line discharging device, and a gate line holding device;
    a first terminal of said gate line charging device is connected to a fundamental clock $CK_n$ (n is an integer of 1 to 4);
    a gate terminal of said gate line charging device is connected to an output terminal of said timing control circuit;
    a second terminal of said gate line charging device is connected to a first terminal of said gate line discharging device and a first terminal of said gate line holding device and becomes an output terminal of said fundamental circuit;

a gate terminal of said gate line discharging device is connected to an output terminal of said fundamental circuit of a post stage and connected to a second auxiliary pulse in said fundamental circuit of a final stage;

a second terminal of said gate line discharging device is connected to a low-level voltage;

a gate terminal of said gate line holding device is connected to an output terminal of said first holding device control circuit; and a second terminal of said gate line holding device is connected to the low-level voltage;

wherein:

said first holding device control circuit comprises a setting device, a resetting device, and a holding capacitor;

a first terminal and a gate terminal of said setting device are connected to a fundamental clock $CK_{n+1}$ (n is an integer of 1 to 4; however, when n=4, CK1);

a second terminal of said setting device is connected to a first terminal of said resetting device and a first terminal of said holding capacitor and becomes the output terminal of said first holding device control circuit;

a gate terminal of said resetting device is connected to a first auxiliary pulse in said fundamental circuit of a first stage and connected to an output terminal of said fundamental circuit of a front stage in said fundamental circuits of a second stage;

a second terminal of said resetting device is connected to the low-level voltage; and a second terminal of said holding capacitor is connected to the low-level voltage;

wherein:

said second holding device control circuit comprises a setting device, a resetting device, and a holding capacitor;

a first terminal and a gate terminal of said setting device are connected to a fundamental clock $CK_{n+1}$ (n is an integer of 1 to 4; however, when n=4, CK1);

a second terminal of said setting device is connected to a first terminal of said resetting device and a first terminal of said holding capacitor and becomes an output terminal of said second holding device control circuit;

a gate terminal of said resetting device is connected to a third auxiliary pulse in said fundamental circuit of a first stage, connected to a first auxiliary pulse in said fundamental circuit of a second stage, and connected to an output terminal of said fundamental circuit of two stages before in said fundamental circuits of a third and subsequent stages;

a second terminal of said resetting device is connected to the low-level voltage; and a second terminal of said holding capacitor is connected to the low-level voltage;

wherein:

said timing control circuit comprises a GDC charging device, a GDC discharging device, and a GDC holding device;

a first terminal and a gate terminal of said GDC charging device are connected to a first auxiliary pulse in said fundamental circuit of a first stage and connected to an output terminal of said fundamental circuit of a front stage in said fundamental circuits of a second and subsequent stages;

a second terminal of said GDC charging device is connected to a first terminal of said GDC discharging device and a first terminal of said GDC holding device and becomes the output terminal of said timing control circuit;

a gate terminal of said GDC discharging device is connected to the output terminal of said fundamental circuit of the post stage and connected to the second auxiliary pulse in said fundamental circuit of the final stage;

a second terminal of said GDC discharging device is connected to the low-level voltage;

a gate terminal of said GDC holding device is connected to an output terminal of said second holding device control circuit; and a second terminal of said GDC holding device is connected to the low-level voltage.

4. The shift register circuit according to claim 3, wherein said shift register circuit is arranged in a matrix form in a display apparatus to drive pixel portions.

5. The shift register circuit according to claim 3, wherein said shift register circuit is arranged on either or both sides of pixel portions formed in a matrix form in a display apparatus, said shift register circuit is configured to drive either or both of even-number scanning lines and odd-number scanning lines, wirings for transferring an output of said fundamental circuit to the fundamental circuits of the front and post stages also function as gate wirings of said pixel portions formed in the matrix form.

6. A shift register circuit constructed by connecting a plurality of fundamental circuits each comprising a gate line driving circuit, a timing control circuit, a first holding device control circuit, and a second holding device control circuit, wherein:

said gate line driving circuit has a gate line charging device, a gate line discharging device, and a gate line holding device;

a first terminal of said gate line charging device is connected to a fundamental clock $CK_n$ (n is an integer of 1 to 4);

a gate terminal of said gate line charging device is connected to an output terminal of said timing control circuit;

a second terminal of said gate line charging device is connected to a first terminal of said gate line discharging device and a first terminal of said gate line holding device and becomes an output terminal of said fundamental circuit;

a gate terminal of said gate line discharging device is connected to an output terminal of said fundamental circuit of a post stage and connected to a second auxiliary pulse in said fundamental circuit of a final stage;

a second terminal of said gate line discharging device is connected to a low-level voltage;

a gate terminal of said gate line holding device is connected to an output terminal of said first holding device control circuit; and a second terminal of said gate line holding device is connected to the low-level voltage;

wherein:

said first holding device control circuit comprises a setting device, a resetting device, and a holding capacitor;

a first terminal and a gate terminal of said setting device are connected to a fundamental clock $CK_{n+1}$ (n is an integer of 1 to 4; however, when n=4, CK1);

a second terminal of said setting device is connected to a first terminal of said resetting device and a first terminal of said holding capacitor and becomes the output terminal of said first holding device control circuit;

a gate terminal of said resetting device is connected to a first auxiliary pulse in said fundamental circuit of a first stage and connected to an output terminal of said fundamental circuit of a front stage in said fundamental circuits of a second stage;
a second terminal of said resetting device is connected to the low-level voltage; and
a second terminal of said holding capacitor is connected to the low-level voltage;
wherein:
said second holding device control circuit comprises a setting device, a resetting device, and a holding capacitor;
a first terminal and a gate terminal of said setting device are connected to a fundamental clock $CK_{n+1}$ (n is an integer of 1 to 4; however, when n=4, CK1);
a second terminal of said setting device is connected to a first terminal of said resetting device and a first terminal of said holding capacitor and becomes an output terminal of said second holding device control circuit;
a gate terminal of said resetting device is connected to a third auxiliary pulse in said fundamental circuit of a first stage, connected to a first auxiliary pulse in said fundamental circuit of a second stage, and connected to an output terminal of said fundamental circuit of two stages before in said fundamental circuits of a third and subsequent stages;
a second terminal of said resetting device is connected to the low-level voltage; and
a second terminal of said holding capacitor is connected to the low-level voltage;
wherein:
said timing control circuit comprises a GDC charging device, a GDC discharging device, and a GDC holding device;
a first terminal of said GDC charging device is connected to a high-level voltage;
a gate terminal of said GDC charging device is connected to a first auxiliary pulse in said fundamental circuit of a first stage and connected to an output terminal of said fundamental circuit of a front stage in said fundamental circuits of a second and subsequent stages;
a second terminal of said GDC charging device is connected to a first terminal of said GDC discharging device and a first terminal of said GDC holding device and becomes the output terminal of said timing control circuit;
a gate terminal of said GDC discharging device is connected to the output terminal of said fundamental circuit of the post stage and connected to the second auxiliary pulse in said fundamental circuit of the final stage;
a second terminal of said GDC discharging device is connected to the low-level voltage;
a gate terminal of said GDC holding device is connected to an output terminal of said second holding device control circuit; and
a second terminal of said GDC holding device is connected to the low-level voltage.

7. The shift register circuit according to claim 6, wherein said shift register circuit is arranged in a matrix form in a display apparatus to drive pixel portions.

8. The shift register circuit according to claim 6, wherein said shift register circuit is arranged on either or both sides of pixel portions formed in a matrix form in a display apparatus, said shift register circuit is configured to drive either or both of even-number scanning lines and odd-number scanning lines, wirings for transferring an output of said fundamental circuit to the fundamental circuits of the front and post stages also function as gate wirings of said pixel portions formed in the matrix form.

9. A shift register circuit constructed by connecting a plurality of fundamental circuits each comprising a gate line driving circuit, a timing control circuit, a first holding device control circuit, and a second holding device control circuit, wherein:
said gate line driving circuit has a gate line charging device, a gate line discharging device, and a gate line holding device;
a first terminal of said gate line charging device is connected to a fundamental clock $CK_n$ (n is an integer of 1 to 4);
a gate terminal of said gate line charging device is connected to an output terminal of said timing control circuit;
a second terminal of said gate line charging device is connected to a first terminal of said gate line discharging device and a first terminal of said gate line holding device and becomes an output terminal of said fundamental circuit;
a gate terminal of said gate line discharging device is connected to an output terminal of said fundamental circuit of a post stage and connected to a second auxiliary pulse in said fundamental circuit of a final stage;
a second terminal of said gate line discharging device is connected to a low-level voltage;
a gate terminal of said gate line holding device is connected to an output terminal of said first holding device control circuit; and
a second terminal of said gate line holding device is connected to the low-level voltage;
wherein:
said first holding device control circuit comprises a setting device, a resetting device, and a holding capacitor;
a first terminal of said setting device is connected to a high-level voltage;
a gate terminal of said setting device is connected to a fundamental clock $CK_{n+1}$ (n is an integer of 1 to 4; however, when n=4, CK1);
a second terminal of said setting device is connected to a first terminal of said resetting device and a first terminal of said holding capacitor and becomes the output terminal of said first holding device control circuit;
a gate terminal of said resetting device is connected to a first auxiliary pulse in said fundamental circuit of a first stage and connected to an output terminal of said fundamental circuit of a front stage in said fundamental circuits of a second and subsequent stages;
a second terminal of said resetting device is connected to the low-level voltage; and
a second terminal of said holding capacitor is connected to the low-level voltage;
wherein:
said second holding device control circuit comprises a setting device, a resetting device, and a holding capacitor;
a first terminal of said setting device is connected to a high-level voltage;
a gate terminal of said setting device is connected to a fundamental clock $CK_{n+1}$ (n is an integer of 1 to 4; however, when n=4, CK1);
a second terminal of said setting device is connected to a first terminal of said resetting device and a first terminal of said holding capacitor and becomes an output terminal of said second holding device control circuit;

a gate terminal of said resetting device is connected to a third auxiliary pulse in said fundamental circuit of a first stage, connected to a first auxiliary pulse in said fundamental circuit of a second stage, and connected to an output terminal of said fundamental circuit of two stages before in said fundamental circuits of a third and subsequent stages;

a second terminal of said resetting device is connected to the low-level voltage; and a second terminal of said holding capacitor is connected to the low-level voltage;

wherein:

said timing control circuit comprises a GDC charging device, a GDC discharging device, and a GDC holding device;

a first terminal and a gate terminal of said GDC charging device are connected to a first auxiliary pulse in said fundamental circuit of a first stage and connected to an output terminal of said fundamental circuit of a front stage in said fundamental circuits of a second and subsequent stages;

a second terminal of said GDC charging device is connected to a first terminal of said GDC discharging device and a first terminal of said GDC holding device and becomes the output terminal of said timing control circuit;

a gate terminal of said GDC discharging device is connected to the output terminal of said fundamental circuit of the post stage and connected to the second auxiliary pulse in said fundamental circuit of the final stage;

a second terminal of said GDC discharging device is connected to the low-level voltage;

a gate terminal of said GDC holding device is connected to an output terminal of said second holding device control circuit; and a second terminal of said GDC holding device is connected to the low-level voltage.

10. The shift register circuit according to claim 9, wherein said shift register circuit is arranged in a matrix form in a display apparatus to drive pixel portions.

11. The shift register circuit according to claim 9, wherein said shift register circuit is arranged on either or both sides of pixel portions formed in a matrix form in a display apparatus, said shift register circuit is configured to drive either or both of even-number scanning lines and odd-number scanning lines, wirings for transferring an output of said fundamental circuit to the fundamental circuits of the front and post stages also function as gate wirings of said pixel portions formed in the matrix form.

12. A shift register circuit constructed by connecting a plurality of fundamental circuits each comprising a gate line driving circuit, a timing control circuit, a first holding device control circuit, and a second holding device control circuit, wherein:

said gate line driving circuit has a gate line charging device, a gate line discharging device, and a gate line holding device;

a first terminal of said gate line charging device is connected to a fundamental clock $CK_n$ (n is an integer of 1 to 4);

a gate terminal of said gate line charging device is connected to an output terminal of said timing control circuit;

a second terminal of said gate line charging device is connected to a first terminal of said gate line discharging device and a first terminal of said gate line holding device and becomes an output terminal of said fundamental circuit;

a gate terminal of said gate line discharging device is connected to an output terminal of said fundamental circuit of a post stage and connected to a second auxiliary pulse in said fundamental circuit of a final stage;

a second terminal of said gate line discharging device is connected to a low-level voltage;

a gate terminal of said gate line holding device is connected to an output terminal of said first holding device control circuit; and a second terminal of said gate line holding device is connected to the low-level voltage;

wherein:

said first holding device control circuit comprises a setting device, a resetting device, and a holding capacitor;

a first terminal of said setting device is connected to a high-level voltage;

a gate terminal of said setting device is connected to a fundamental clock $CK_{n+1}$ (n is an integer of 1 to 4; however, when n=4, CK1);

a second terminal of said setting device is connected to a first terminal of said resetting device and a first terminal of said holding capacitor and becomes the output terminal of said first holding device control circuit;

a gate terminal of said resetting device is connected to a first auxiliary pulse in said fundamental circuit of a first stage and connected to an output terminal of said fundamental circuit of a front stage in said fundamental circuits of a second and subsequent stages;

a second terminal of said resetting device is connected to the low-level voltage; and a second terminal of said holding capacitor is connected to the low-level voltage;

wherein:

said second holding device control circuit comprises a setting device, a resetting device, and a holding capacitor;

a first terminal of said setting device is connected to a high-level voltage;

a gate terminal of said setting device is connected to a fundamental clock $CK_{n+1}$ (n is an integer of 1 to 4; however, when n=4, CK1);

a second terminal of said setting device is connected to a first terminal of said resetting device and a first terminal of said holding capacitor and becomes an output terminal of said second holding device control circuit;

a gate terminal of said resetting device is connected to a third auxiliary pulse in said fundamental circuit of a first stage, connected to a first auxiliary pulse in said fundamental circuit of a second stage, and connected to an output terminal of said fundamental circuit of two stages before in said fundamental circuits of a third and subsequent stages;

a second terminal of said resetting device is connected to the low-level voltage; and a second terminal of said holding capacitor is connected to the low-level voltage;

wherein:

said timing control circuit comprises a GDC charging device, a GDC discharging device, and a GDC holding device;

a first terminal of said GDC charging device is connected to a high-level voltage;

a gate terminal of said GDC charging device is connected to a first auxiliary pulse in said fundamental circuit of a first stage and connected to an output terminal of said fundamental circuit of a front stage in said fundamental circuits of a second and subsequent stages;

a second terminal of said GDC charging device is connected to a first terminal of said GDC discharging device and a first terminal of said GDC holding device and becomes the output terminal of said timing control circuit;

a gate terminal of said GDC discharging device is connected to the output terminal of said fundamental circuit of the post stage and connected to the second auxiliary pulse in said fundamental circuit of the final stage;

a second terminal of said GDC discharging device is connected to the low-level voltage;

a gate terminal of said GDC holding device is connected to an output terminal of said second holding device control circuit; and a second terminal of said GDC holding device is connected to the low-level voltage.

13. The shift register circuit according to claim 12, wherein said shift register circuit is arranged in a matrix form in a display apparatus to drive pixel portions.

14. The shift register circuit according to claim 12, wherein said shift register circuit is arranged on either or both sides of pixel portions formed in a matrix form in a display apparatus, said shift register circuit is configured to drive either or both of even-number scanning lines and odd-number scanning lines, wirings for transferring an output of said fundamental circuit to the fundamental circuits of the front and post stages also function as gate wirings of said pixel portions formed in the matrix form.

15. A shift register circuit constructed by connecting a plurality of fundamental circuits each comprising a gate line driving circuit, a timing control circuit, a first holding device control circuit, and a second holding device control circuit, wherein:

said gate line driving circuit has a gate line charging device, a gate line discharging device, and a gate line holding device;

a first terminal of said gate line charging device is connected to a fundamental clock $CK_n$ (n is an integer of 1 to 4);

a gate terminal of said gate line charging device is connected to an output terminal of said timing control circuit;

a second terminal of said gate line charging device is connected to a first terminal of said gate line discharging device and a first terminal of said gate line holding device and becomes an output terminal of said fundamental circuit;

a gate terminal of said gate line discharging device is connected to an output terminal of said fundamental circuit of a post stage and connected to a second auxiliary pulse in said fundamental circuit of a final stage;

a second terminal of said gate line discharging device is connected to a low-level voltage;

a gate terminal of said gate line holding device is connected to an output terminal of said first holding device control circuit; and a second terminal of said gate line holding device is connected to the low-level voltage;

wherein:

said first holding device control circuit comprises a setting device, a resetting device, and a holding capacitor;

a first terminal and a gate terminal of said setting device are connected to a fundamental clock $CK_{n+1}$ (n is an integer of 1 to 4; however, when n=4, CK1);

a second terminal of said setting device is connected to a first terminal of said resetting device and a first terminal of said holding capacitor and becomes the output terminal of said first holding device control circuit;

a gate terminal of said resetting device is connected to a first auxiliary pulse in said fundamental circuit of a first stage and connected to an output terminal of said fundamental circuit of a front stage in said fundamental circuits of a second and subsequent stage;

a second terminal of said resetting device is connected to the low-level voltage; and a second terminal of said holding capacitor is connected to the low-level voltage;

wherein:

said second holding device control circuit comprises a setting device, a resetting device, and a holding capacitor;

a first terminal of said setting device is connected to a high-level voltage;

a gate terminal of said setting device is connected to a fundamental clock $CK_{n+1}$ (n is an integer of 1 to 4; however, when n=4, CK1);

a second terminal of said setting device is connected to a first terminal of said resetting device and a first terminal of said holding capacitor and becomes an output terminal of said second holding device control circuit;

a gate terminal of said resetting device is connected to a third auxiliary pulse in said fundamental circuit of a first stage, connected to a first auxiliary pulse in said fundamental circuit of a second stage, and connected to an output terminal of said fundamental circuit of two stages before in said fundamental circuits of a third and subsequent stages;

a second terminal of said resetting device is connected to the low-level voltage; and a second terminal of said holding capacitor is connected to the low-level voltage;

wherein:

said timing control circuit comprises a GDC charging device, a GDC discharging device, and a GDC holding device;

a first terminal and a gate terminal of said GDC charging device are connected to a first auxiliary pulse in said fundamental circuit of a first stage and connected to an output terminal of said fundamental circuit of a front stage in said fundamental circuits of a second and subsequent stages;

a second terminal of said GDC charging device is connected to a first terminal of said GDC discharging device and a first terminal of said GDC holding device and becomes the output terminal of said timing control circuit;

a gate terminal of said GDC discharging device is connected to the output terminal of said fundamental circuit of the post stage and connected to the second auxiliary pulse in said fundamental circuit of the final stage;

a second terminal of said GDC discharging device is connected to the low-level voltage;

a gate terminal of said GDC holding device is connected to an output terminal of said second holding device control circuit; and a second terminal of said GDC holding device is connected to the low-level voltage.

16. The shift register circuit according to claim 15, wherein said shift register circuit is arranged in a matrix form in a display apparatus to drive pixel portions.

17. The shift register circuit according to claim 15, wherein said shift register circuit is arranged on either or both sides of pixel portions formed in a matrix form in a display apparatus, said shift register circuit is configured to drive either or both of even-number scanning lines and odd-number scanning lines, wirings for transferring an output of said fundamental circuit to the fundamental circuits of the front and post stages also function as gate wirings of said pixel portions formed in the matrix form.

18. A shift register circuit constructed by connecting a plurality of fundamental circuits each comprising a gate line driving circuit, a timing control circuit, a first holding device control circuit, and a second holding device control circuit, wherein:

said gate line driving circuit has a gate line charging device, a gate line discharging device, and a gate line holding device;

a first terminal of said gate line charging device is connected to a fundamental clock $CK_n$ (n is an integer of 1 to 4);

a gate terminal of said gate line charging device is connected to an output terminal of said timing control circuit;

a second terminal of said gate line charging device is connected to a first terminal of said gate line discharging device and a first terminal of said gate line holding device and becomes an output terminal of said fundamental circuit;

a gate terminal of said gate line discharging device is connected to an output terminal of said fundamental circuit of a post stage and connected to a second auxiliary pulse in said fundamental circuit of a final stage;

a second terminal of said gate line discharging device is connected to a low-level voltage;

a gate terminal of said gate line holding device is connected to an output terminal of said first holding device control circuit; and a second terminal of said gate line holding device is connected to the low-level voltage;

wherein:

said first holding device control circuit comprises a setting device, a resetting device, and a holding capacitor;

a first terminal and a gate terminal of said setting device are connected to a fundamental clock $CK_{n+1}$ (n is an integer of 1 to 4; however, when n=4, CK1);

a second terminal of said setting device is connected to a first terminal of said resetting device and a first terminal of said holding capacitor and becomes the output terminal of said first holding device control circuit;

a gate terminal of said resetting device is connected to a first auxiliary pulse in said fundamental circuit of a first stage and connected to an output terminal of said fundamental circuit of a front stage in said fundamental circuits of a second and subsequent stage;

a second terminal of said resetting device is connected to the low-level voltage; and a second terminal of said holding capacitor is connected to the low-level voltage;

wherein:

said second holding device control circuit comprises a setting device, a resetting device, and a holding capacitor;

a first terminal of said setting device is connected to a high-level voltage;

a gate terminal of said setting device is connected to a fundamental clock $CK_{n+1}$ (n is an integer of 1 to 4; however, when n=4, CK1);

a second terminal of said setting device is connected to a first terminal of said resetting device and a first terminal of said holding capacitor and becomes an output terminal of said second holding device control circuit;

a gate terminal of said resetting device is connected to a third auxiliary pulse in said fundamental circuit of a first stage, connected to a first auxiliary pulse in said fundamental circuit of a second stage, and connected to an output terminal of said fundamental circuit of two stages before in said fundamental circuits of a third and subsequent stages;

a second terminal of said resetting device is connected to the low-level voltage; and a second terminal of said holding capacitor is connected to the low-level voltage;

wherein:

said timing control circuit comprises a GDC charging device, a GDC discharging device, and a GDC holding device;

a first terminal of said GDC charging device is connected to a high-level voltage;

a gate terminal of said GDC charging device is connected to a first auxiliary pulse in said fundamental circuit of a first stage and connected to an output terminal of said fundamental circuit of a front stage in said fundamental circuits of a second and subsequent stages;

a second terminal of said GDC charging device is connected to a first terminal of said GDC discharging device and a first terminal of said GDC holding device and becomes the output terminal of said timing control circuit;

a gate terminal of said GDC discharging device is connected to the output terminal of said fundamental circuit of the post stage and connected to the second auxiliary pulse in said fundamental circuit of the final stage;

a second terminal of said GDC discharging device is connected to the low-level voltage;

a gate terminal of said GDC holding device is connected to an output terminal of said second holding device control circuit; and a second terminal of said GDC holding device is connected to the low-level voltage.

19. The shift register circuit according to claim 18, wherein said shift register circuit is arranged in a matrix form in a display apparatus to drive pixel portions.

20. The shift register circuit according to claim 18, wherein said shift register circuit is arranged on either or both sides of pixel portions formed in a matrix form in a display apparatus, said shift register circuit is configured to drive either or both of even-number scanning lines and odd-number scanning lines, wirings for transferring an output of said fundamental circuit to the fundamental circuits of the front and post stages also function as gate wirings of said pixel portions formed in the matrix form.

21. A shift register circuit constructed by connecting a plurality of fundamental circuits each comprising a gate line driving circuit, a timing control circuit, a first holding device control circuit, and a second holding device control circuit, wherein:

said gate line driving circuit has a gate line charging device, a gate line discharging device, and a gate line holding device;

a first terminal of said gate line charging device is connected to a fundamental clock $CK_n$ (n is an integer of 1 to 4);

a gate terminal of said gate line charging device is connected to an output terminal of said timing control circuit;

a second terminal of said gate line charging device is connected to a first terminal of said gate line discharging device and a first terminal of said gate line holding device and becomes an output terminal of said fundamental circuit;

a gate terminal of said gate line discharging device is connected to an output terminal of said fundamental circuit of a post stage and connected to a second auxiliary pulse in said fundamental circuit of a final stage;

a second terminal of said gate line discharging device is connected to a low-level voltage;

a gate terminal of said gate line holding device is connected to an output terminal of said first holding device control circuit; and a second terminal of said gate line holding device is connected to the low-level voltage;

wherein:

said first holding device control circuit comprises a setting device, a resetting device, and a holding capacitor;

a first terminal of said setting device is connected to a high-level voltage;

a gate terminal of said setting device is connected to a fundamental clock $CK_{n+1}$ (n is an integer of 1 to 4; however, when n=4, CK1);

a second terminal of said setting device is connected to a first terminal of said resetting device and a first terminal of said holding capacitor and becomes the output terminal of said first holding device control circuit;

a gate terminal of said resetting device is connected to a first auxiliary pulse in said fundamental circuit of a first stage and connected to an output terminal of said fundamental circuit of a front stage in said fundamental circuits of a second and subsequent stages;

a second terminal of said resetting device is connected to the low-level voltage; and a second terminal of said holding capacitor is connected to the low-level voltage;

wherein:

said second holding device control circuit comprises a setting device, a resetting device, and a holding capacitor;

a first terminal and a gate terminal of said setting device are connected to a fundamental clock $CK_{n+1}$ (n is an integer of 1 to 4; however, when n=4, CK1);

a second terminal of said setting device is connected to a first terminal of said resetting device and a first terminal of said holding capacitor and becomes an output terminal of said second holding device control circuit;

a gate terminal of said resetting device is connected to a third auxiliary pulse in said fundamental circuit of a first stage, connected to a first auxiliary pulse in said fundamental circuit of a second stage, and connected to an output terminal of said fundamental circuit of two stages before in said fundamental circuits of a third and subsequent stages;

a second terminal of said resetting device is connected to the low-level voltage; and a second terminal of said holding capacitor is connected to the low-level voltage;

wherein:

said timing control circuit comprises a GDC charging device, a GDC discharging device, and a GDC holding device;

a first terminal and a gate terminal of said GDC charging device are connected to a first auxiliary pulse in said fundamental circuit of a first stage and connected to an output terminal of said fundamental circuit of a front stage in said fundamental circuits of a second and subsequent stages;

a second terminal of said GDC charging device is connected to a first terminal of said GDC discharging device and a first terminal of said GDC holding device and becomes the output terminal of said timing control circuit;

a gate terminal of said GDC discharging device is connected to the output terminal of said fundamental circuit of the post stage and connected to the second auxiliary pulse in said fundamental circuit of the final stage;

a second terminal of said GDC discharging device is connected to the low-level voltage;

a gate terminal of said GDC holding device is connected to an output terminal of said second holding device control circuit; and a second terminal of said GDC holding device is connected to the low-level voltage.

22. The shift register circuit according to claim 21, wherein said shift register circuit is arranged in a matrix form in a display apparatus to drive pixel portions.

23. The shift register circuit according to claim 21, wherein said shift register circuit is arranged on either or both sides of pixel portions formed in a matrix form in a display apparatus, said shift register circuit is configured to drive either or both of even-number scanning lines and odd-number scanning lines, wirings for transferring an output of said fundamental circuit to the fundamental circuits of the front and post stages also function as gate wirings of said pixel portions formed in the matrix form.

24. A shift register circuit constructed by connecting a plurality of fundamental circuits each comprising a gate line driving circuit, a timing control circuit, a first holding device control circuit, and a second holding device control circuit, wherein:

said gate line driving circuit has a gate line charging device, a gate line discharging device, and a gate line holding device;

a first terminal of said gate line charging device is connected to a fundamental clock $CK_n$ (n is an integer of 1 to 4);

a gate terminal of said gate line charging device is connected to an output terminal of said timing control circuit;

a second terminal of said gate line charging device is connected to a first terminal of said gate line discharging device and a first terminal of said gate line holding device and becomes an output terminal of said fundamental circuit;

a gate terminal of said gate line discharging device is connected to an output terminal of said fundamental circuit of a post stage and connected to a second auxiliary pulse in said fundamental circuit of a final stage;

a second terminal of said gate line discharging device is connected to a low-level voltage;

a gate terminal of said gate line holding device is connected to an output terminal of said first holding device control circuit; and a second terminal of said gate line holding device is connected to the low-level voltage;

wherein:

said first holding device control circuit comprises a setting device, a resetting device, and a holding capacitor;

a first terminal of said setting device is connected to a high-level voltage;

a gate terminal of said setting device is connected to a fundamental clock $CK_{n+1}$ (n is an integer of 1 to 4; however, when n=4, CK1);

a second terminal of said setting device is connected to a first terminal of said resetting device and a first terminal of said holding capacitor and becomes the output terminal of said first holding device control circuit;

a gate terminal of said resetting device is connected to a first auxiliary pulse in said fundamental circuit of a first stage and connected to an output terminal of said fundamental circuit of a front stage in said fundamental circuits of a second and subsequent stages;

a second terminal of said resetting device is connected to the low-level voltage; and a second terminal of said holding capacitor is connected to the low-level voltage;

wherein:

said second holding device control circuit comprises a setting device, a resetting device, and a holding capacitor;

a first terminal and a gate terminal of said setting device are connected to a fundamental clock $CK_{n+1}$ (n is an integer of 1 to 4; however, when n=4, CK1);

a second terminal of said setting device is connected to a first terminal of said resetting device and a first terminal of said holding capacitor and becomes an output terminal of said second holding device control circuit;

a gate terminal of said resetting device is connected to a third auxiliary pulse in said fundamental circuit of a first stage, connected to a first auxiliary pulse in said fundamental circuit of a second stage, and connected to an output terminal of said fundamental circuit of two stages before in said fundamental circuits of a third and subsequent stages;

a second terminal of said resetting device is connected to the low-level voltage; and a second terminal of said holding capacitor is connected to the low-level voltage;

wherein:

said timing control circuit comprises a GDC charging device, a GDC discharging device, and a GDC holding device;

a first terminal of said GDC charging device is connected to a high-level voltage;

a gate terminal of said GDC charging device is connected to a first auxiliary pulse in said fundamental circuit of a first stage and connected to an output terminal of said fundamental circuit of a front stage in said fundamental circuits of a second and subsequent stages;

a second terminal of said GDC charging device is connected to a first terminal of said GDC discharging device and a first terminal of said GDC holding device and becomes the output terminal of said timing control circuit;

a gate terminal of said GDC discharging device is connected to the output terminal of said fundamental circuit of the post stage and connected to the second auxiliary pulse in said fundamental circuit of the final stage;

a second terminal of said GDC discharging device is connected to the low-level voltage;

a gate terminal of said GDC holding device is connected to an output terminal of said second holding device control circuit; and a second terminal of said GDC holding device is connected to the low-level voltage.

25. The shift register circuit according to claim 24, wherein said shift register circuit is arranged in a matrix form in a display apparatus to drive pixel portions.

26. The shift register circuit according to claim 24, wherein said shift register circuit is arranged on either or both sides of pixel portions formed in a matrix form in a display apparatus, said shift register circuit is configured to drive either or both of even-number scanning lines and odd-number scanning lines, wirings for transferring an output of said fundamental circuit to the fundamental circuits of the front and post stages also function as gate wirings of said pixel portions formed in the matrix form.

* * * * *